(12) United States Patent
Jenny et al.

(10) Patent No.: US 7,601,441 B2
(45) Date of Patent: Oct. 13, 2009

(54) ONE HUNDRED MILLIMETER HIGH PURITY SEMI-INSULATING SINGLE CRYSTAL SILICON CARBIDE WAFER

(75) Inventors: Jason Ronald Jenny, Wake Forest, NC (US); David Phillip Malta, Raleigh, NC (US); Hudson McDonald Hobgood, Pittsboro, NC (US); Stephan Georg Mueller, Durham, NC (US); Mark Brady, Carrboro, NC (US); Robert Tyler Leonard, Raleigh, NC (US); Adrian Powell, Apex, NC (US); Valerl F. Tsvetkov, Durham, NC (US)

(73) Assignee: Cree, Inc., Durham, NC (US)

( * ) Notice: Subject to any disclaimer, the term of this patent is extended or adjusted under 35 U.S.C. 154(b) by 546 days.

(21) Appl. No.: 10/876,963

(22) Filed: Jun. 25, 2004

(65) Prior Publication Data
US 2005/0126471 A1 Jun. 16, 2005

Related U.S. Application Data

(63) Continuation-in-part of application No. 10/064,232, filed on Jun. 24, 2002, now Pat. No. 6,814,801.

(51) Int. Cl.
*B32B 19/00* (2006.01)
*H01L 31/0312* (2006.01)

(52) U.S. Cl. .................. 428/698; 428/409; 257/77; 117/951

(58) Field of Classification Search .................. None
See application file for complete search history.

(56) References Cited

U.S. PATENT DOCUMENTS

| 4,866,005 | A | 9/1989 | Davis et al. |
|---|---|---|---|
| 5,119,540 | A | 6/1992 | Kong et al. |
| 5,151,384 | A | 9/1992 | Williams |
| RE34,861 | E | 2/1995 | Davis et al. |
| 5,611,955 | A | 3/1997 | Barrett et al. |
| 5,679,153 | A | 10/1997 | Dmitriev et al. |
| 5,709,745 | A | 1/1998 | Larkin et al. |
| 5,718,760 | A | 2/1998 | Carter et al. |
| 6,086,672 | A | 7/2000 | Hunter |
| 6,113,451 | A | 9/2000 | Hobart et al. |

(Continued)

FOREIGN PATENT DOCUMENTS

EP 0561462 A2 9/1993

(Continued)

OTHER PUBLICATIONS

Kuhr et al.; "Hexagonal Voids and the Formation of Micropipes During SiC Sublimation Growth," J. Appl.Phys., vol. 89, No. 8, 2001, pp. 4625-4630.

(Continued)

*Primary Examiner*—Timothy M Speer
(74) *Attorney, Agent, or Firm*—Summa, Additon & Ashe, P.A.

(57) ABSTRACT

A single polytype single crystal silicon carbide wafer is disclosed having a diameter greater than three inches and less than five inches, resistivity greater than 10,000 ohm-cm, a micropipe density less than 200 $cm^{-2}$, and a combined concentration of shallow level dopants less than 5E16 $cm^{-3}$.

30 Claims, 9 Drawing Sheets

U.S. PATENT DOCUMENTS

| | | |
|---|---|---|
| 6,201,342 B1 | 3/2001 | Hobart et al. |
| 6,218,680 B1 * | 4/2001 | Carter et al. .................. 257/77 |
| 6,396,080 B2 * | 5/2002 | Carter et al. .................. 257/77 |
| 6,403,982 B2 * | 6/2002 | Carter et al. .................. 257/77 |
| 6,428,621 B1 | 8/2002 | Vodakov et al. |
| 6,451,112 B1 | 9/2002 | Hara et al. |
| 6,507,046 B2 | 1/2003 | Mueller |
| 6,639,247 B2 * | 10/2003 | Carter et al. .................. 257/77 |
| 6,786,969 B2 | 9/2004 | Kondo et al. |
| 6,814,801 B2 | 11/2004 | Jenny et al. |
| 7,135,074 B2 | 11/2006 | Gunjishima et al. |
| 7,300,519 B2 | 11/2007 | Tsvetkov et al. |
| 7,316,747 B2 | 1/2008 | Jenny et al. |
| 2002/0189536 A1 | 12/2002 | Otsuki et al. |
| 2003/0233975 A1 | 12/2003 | Jenny et al. |
| 2004/0201024 A1 | 10/2004 | Tsvetkov et al. |
| 2004/0206298 A1 | 10/2004 | Jenny et al. |
| 2005/0022724 A1 | 2/2005 | Malta et al. |
| 2005/0022727 A1 | 2/2005 | Fechko, Jr. et al. |

FOREIGN PATENT DOCUMENTS

| | | |
|---|---|---|
| EP | 1 160 361 A | 12/2001 |
| JP | 2002060297 | 2/2002 |
| JP | 2002308699 | 10/2002 |
| JP | 2003002794 | 1/2003 |

OTHER PUBLICATIONS

Powell; "Growth of Low Micropipe Density SiC Wafers" Materials Science Forum, vol. 338-340, 2000, pp. 437-440.

Mueller; "Status of SiC Bulk Growth from an Industrial Point of View", Journal of Crystal Growth, vol. 211, No. 1, 2000, pp. 325-332.

Ivanov et al.; "Nitrogen Doping Concentration as determined by Photoluminescence in 4H- and 6H-SiC", Journal of Applied Physics, vol. 80, No. 6, 1996, pp. 3504-3508.

Dmitriev et al.; "Large Area Silicon Carbide Devices Fabricated on SiC Wafers with Reduced Micropipe Density", Materials Science and Engineering, vol. B61-62, 1999, pp. 446-449.

Sanchez et al.; "Formation of Thermal Decomposition Cavities in Physical Vapor Transport of Silicon Carbide", vol. 29, No. 3, 2000, pp. 347-352.

Rabeck et al.; "Thermodynamic Considerations of the Role of Hydrogen in Sublimation Growth", Journal of the Electrochemical Society, vol. 144, 1997, pp. 1024-1027.

Lilov et al.; "Studies of Growth Processes in Silicon Carbide Epitaxial Layers from the Vapour Phase", Journal of Crystal Growth, vol. 32, 1976, pp. 170-178.

Bakin et al.; "State of the Art in Defect Control of Bulk SiC", 1998 High Temperature Electronic Materials, Devices and Sensors Conference, 1998.

Muller et al., Progress in the Industrial Production of SiC Substrates for Semiconductor Devices; Materials Science and Engineering; Mar. 22, 2001; pp. 327-331.

Search Report for ROC (Taiwan) Patent Application No. 094121084; Search Completion Date Apr. 14, 2007, 1 page.

U.S. Appl. No. 11/248,579, for Seeded Single Crystal Silicon Carbide Growth and Resulting Crystals; filed Oct. 12, 2005.

* cited by examiner

ONE HUNDRED MILLIMETER HIGH PURITY SEMI-INSULATING SINGLE CRYSTAL SILICON CARBIDE WAFER

CROSS REFERENCE TO RELATED APPLICATIONS

The present invention is a continuation in part of and commonly assigned application Ser. No. 10/064,232 filed Jun. 24, 2002 now U.S. Pat. No. 6,814,801 for "Method for Producing Semi-Insulating Resistivity in High Purity Silicon Carbide Crystals," and now published as No. 20030233975. This application also claims priority from copending application Ser. No. 10/628,188 filed Jul. 28, 2003 for "Reducing Nitrogen Content in Silicon Carbide Crystals by Sublimation Growth in a Hydrogen-Containing Ambient"; application Ser. No. 10/628,189 filed Jul. 28, 2003 for "Growth of Ultra-High Purity Silicon Carbide Crystals in an Ambient Containing Hydrogen"; and application Ser. No. 10/814,075, filed Mar. 31, 2004 for "Process for Producing High Quality Large Size Silicon Carbide Crystals."

STATEMENT OF GOVERNMENT INTEREST

The U.S. Government has a paid-up license in this invention and the right in limited circumstances to require the patent owner to license others on reasonable terms as provided for by the terms of Contract No. N00014-02-C-0306 awarded by Defense Advanced Research Projects Agency (DARPA).

The present invention also relates to the inventions set forth in commonly assigned U.S. Pat. Nos. 6,218,680; 6,396,080; 6,403,982; 6,639,247; and 6,507,046. These issued patents are incorporated entirely herein by reference.

BACKGROUND

The present invention relates to semi-insulating silicon carbide single crystals, and in particular, relates to methods of forming high purity semi-insulating silicon carbide single crystal wafers that are at least 100 millimeters (mm) in diameter. Because of the relationship between English and Metric units (e.g., 25.4 mm=1 inch), such wafers are also referred to as "four inch" wafers.

Silicon carbide (SiC) has a combination of electrical and physical properties that make it an attractive semiconductor material for high temperature, high voltage, high frequency and high power electronic devices. These properties include a 3.0 electron-volt (eV) bandgap (6H), a 4 Megavolt per centimeter (MV/cm) electric field breakdown, a 4.9 W/cmK thermal conductivity, and a $2 \times 10^7$ centimeter per second (cm/s) electron drift velocity. Silicon carbide is also particularly useful in its ability to be made conductive by doping or semi-insulating by various processing techniques. These qualities make silicon carbide a material of choice for a vast array of electronic applications.

The production of integrated circuits for many applications, such as RF devices, requires a semi-insulating substrate on which electronic devices can be built and connected to one another. Historically, sapphire was used as substrate material for microwave devices because of its high resistance to current flow. Sapphire has the disadvantage, however, of limiting the types of semiconductor layers that may be fabricated on the substrate with appropriate crystal lattice matching for proper device operation.

As used herein, the terms "high resistivity" and "semi-insulating" can be considered synonymous for most purposes. In general, both terms describe a semiconductor material having a resistivity greater than about 1500 ohm-centimeters (ohm-cm). In this regard, semi-insulating silicon carbide devices should have a substrate resistivity of at least 1500 ohm-centimeters (ohm-cm) in order to achieve RF passive behavior. Furthermore, resistivities of 5000 ohm-cm or better are needed to minimize device transmission line losses to an acceptable level of 0.1 dB/cm or less. For device isolation and to minimize back-gating effects, the resistivity of semi-insulating silicon carbide should approach a range of 50,000 ohm-cm or higher.

Research in the field shows that the semi-insulating behavior of a silicon carbide substrate is the result of energy levels deep within the band gap of the silicon carbide; i.e., farther from both the valence band and the conduction band than the energy levels created by p-type and n- type dopants. These "deep" energy levels are believed to consist of states lying at least 300 meV away from the conduction or valence band edges, e.g., U.S. Pat. No. 5,611,955 which is representative of standard prior research in this art.

As set forth in the above- referenced patents and applications, it has been discovered that semi-insulating silicon carbide can be produced without the use of vanadium as the dopant to create deep level states that produce the semi-insulating character.

Although vanadium can produce a semi-insulating silicon carbide crystal, its presence has been observed to create a back-gating effect; i.e., the trapped negative charge on the vanadium acts as a grown-in gate in devices in which a vanadium-doped crystal is used as the semi-insulating substrate. Thus, for certain device considerations, vanadium is best avoided.

In the above-referenced issued patents, a semi-insulating silicon carbide crystal is described that includes donor dopants, acceptor dopants and intrinsic point defects that produce deep level states. When the concentration of intrinsic point defects exceeds the difference between the concentration of donors and the concentration of acceptors, the states resulting from intrinsic point defects can provide semi-insulating characteristics in the functional absence of vanadium; i.e., including a minimal presence that is less than the presence that can affect the electronic properties of the crystal.

The requirements for and the advantages of semi-insulating substrates, their use in devices, particularly microwave devices, and the associated and particular requirements for silicon carbide semi-insulating substrates are set forth in detail in the above- referenced issued patents, and are generally well understood in the art from a background standpoint. Thus, they will not be repeated in detail herein. For reference purposes, a relevant discussion is set forth in U.S. Pat. No. 6,218,680 ('the '680 patent") at column 1, line 14 through column 3, line 33.

To this discussion it should be added, however, that the ever-increasing demand for wireless communication services, including high bandwidth delivery of Internet access and related services, drives a corresponding demand for devices and circuits that can support such delivery, which in turn calls for materials—such as semi-insulating silicon carbide—from which devices having the required capabilities can be manufactured.

Accordingly, the '680 patent explains that superior microwave performance can be achieved by the fabrication of silicon carbide field effect transistors (FETs) and related devices on high purity, vanadium-free semi-insulating monocrystalline silicon carbide substrates. As set forth in the '680 patent, the substrates derive their semi-insulating properties from the presence of intrinsic (point defect related) deep electronic states lying near the middle of the silicon carbide bandgap. The intrinsic deep states generally arise during growth of a crystal boule at high temperatures from which substrate wafers are cut in a manner generally well understood in this art.

In devices that incorporate these substrates, and in order to provide the appropriate low-loss RF performance, the substrate must act as a low-loss dielectric medium by continuously maintaining its semi-insulating characteristics. In turn, the ability to maintain semi-insulating behavior is dependent upon the total number of intrinsic deep states in the substrate. In current practice, if the density of the intrinsic deep levels is not sufficiently high it has been observed in practice that the semi-insulating characteristics of the substrate can become reduced or functionally eliminated when subsequent steps are carried out on or using a semi-insulating silicon carbide wafer. Such steps include the growth of epitaxial layers at temperatures of about (for illustrative purposes) 1400° or above on the semi-insulating silicon carbide wafer. This in turn reduces the number of useful devices that can be formed on or incorporating the wafers.

Although the inventors do not wish to be bound by any particular theory, it appears that when semi-insulating silicon carbide substrate wafers of this type are subjected to process steps at temperatures within certain ranges, the subsequent processing can act as an anneal that reduces the number of point defects. This can be thought of in the positive sense that a higher quality crystal is created, but it is disadvantageous when the number of intrinsic point defects is the basis for the semi-insulating character of the substrate wafer.

Stated differently, if kept within a particular temperature range for a sufficient time, the crystal equilibrium or near-equilibrium will shift to one in which the number of point defects is reduced; i.e., the crystal becomes more ordered (fewer point defects) at lower temperatures than it was at higher temperatures, in a manner expected in accordance with well-understood thermodynamic principles.

As another factor, silicon carbide grown by most techniques is generally too conductive for semi-insulating purposes, however. In particular, the nominal or unintentional nitrogen concentration in silicon carbide tends to be high enough in sublimation grown crystals ($\geqq 1\text{-}2 \times 10^{17}$ 17/ cm$^3$) to provide sufficient conductivity to prevent silicon carbide from being used in devices that require a semi-insulating substrate, such as microwave devices.

A recurring issue in fabricating silicon carbide crystals for electronic devices, therefore, is the control of elemental impurities such as nitrogen within the crystal. Nitrogen content, for example, affects the color of a silicon carbide crystal. This color change can have deleterious consequences for the usefulness of a crystal in certain applications requiring luminescence, such as light emitting diodes and gemstone fabrication. The nitrogen in a crystal may also yield electrical conductivity that must be controlled for silicon carbide to have appropriate properties in diverse electronic applications. The invention herein includes a means for achieving a semi-insulating silicon carbide crystal one step of which comprises reducing the nitrogen content, and therefore the inherent conductivity of a crystal with an improved method of sublimation growth in a hydrogen ambient atmosphere.

Researchers, therefore, persistently struggle with the issue of controlling, and particularly reducing, the amount of nitrogen that is transferred from the atmosphere of a sublimation growth chamber into a growing silicon carbide crystal. Commonly assigned U.S. Pat. No. 5,718,760 to Carter et al., for example, discloses a method of reducing the nitrogen concentration in the ambient atmosphere of a silicon carbide sublimation system. The Carter '760 patent reduces the nitrogen by back filling the growth chamber with an inert gas such as argon and then evacuating the growth chamber to a very low pressure.

Another technique for decreasing the ambient nitrogen in a crystal growth system is the minimization of nitrogen content in the equipment itself. Commonly assigned U.S. Pat. No. 5,119,540 issued to Kong et al., discloses that most, if not all, of the undesired nitrogen in a crystal growth system is a result of nitrogen gas that escapes from the equipment itself. For example, nitrogen trapped in graphite equipment may leak into the ambient atmosphere because the equipment cracks or develops pin holes through which nitrogen escapes at very high temperatures. The Kong '540 patent prevents incorporation of nitrogen into subject silicon carbide crystals by utilizing fabrication equipment made of materials with low nitrogen concentration. The Kong '540 patent, therefore, teaches that extremely pure equipment components that are free of high nitrogen content result in silicon carbide crystals that are less contaminated with undesirable levels of nitrogen. Kong '540 shows nitrogen minimization in a chemical vapor deposition system but is equally pertinent in the sublimation systems discussed herein.

In addition to reducing the concentration of nitrogen, researchers also reduce the effects of unavoidable nitrogen content within a silicon carbide crystal. For example, the Carter '760 patent acknowledges that the background nitrogen in the sublimation chamber can lead to undesirable crystal color. The '760 patent, therefore, discloses a method of compensating the nitrogen content with a corresponding p-type dopant to minimize or eliminate the undesirable effects of the nitrogen. The p-type dopant and the nitrogen compensate one another and prevent undesirable color centers in the preferably colorless silicon carbide crystal of the Carter '760 invention.

The nitrogen compensation technique has also been used to prevent unintentional nitrogen doping from dominating the conductivity of silicon carbide crystals. The '680 patent discloses a further method of compensating the nitrogen content of a silicon carbide crystal grown by sublimation. Carter points out that boron may be used to compensate the inherent nitrogen. Carter '680 also utilizes the temperature gradient in the disclosed sublimation process to create point defects in a silicon carbide crystal. The Carter '680 technique pairs an undesirable nitrogen concentration in the silicon carbide crystal with a corresponding acceptor dopant, such as boron. Carter '680 then pairs any excess dopants with temperature induced point defects to yield a desired semi-insulating crystal.

Other research also concedes that unintentional nitrogen incorporation occurs in silicon carbide crystals grown by sublimation. This research tends to focus on means for minimizing the effects of the undesirable nitrogen concentration instead of preventing the nitrogen incorporation from the outset. The '955 patent cited above and issued to Barrett et al. is illustrative of this point. Barrett '955 shows a means of introducing elements such as vanadium into the semiconductor material that create deep energy states within the forbidden energy gap. The Barrett '955 method accounts for nitrogen content in a silicon carbide crystal by trapping the nitrogen and hindering electron mobility from the nitrogen. Barrett, therefore, achieves a semi-insulating silicon carbide substrate by adjusting the effects of the nitrogen instead of preventing its presence in the crystal.

The techniques set forth in the two Carter patents, which have a common assignee as the invention described and claimed herein, are useful for their respective purposes to minimize the effects of nitrogen incorporation in a silicon carbide crystal. The Barrett '955 patent requires further elemental doping and can give rise to unpredictable electrical responses in a subject silicon carbide crystal.

A need continues to exist, therefore, for a method of gaining extensive control over the incorporation of nitrogen into a silicon carbide crystal at the point of initial sublimation. By controlling the nitrogen content from the initial growth of the crystal, compensation techniques and the associated process steps may be minimized. Controlling the nitrogen incorporation also allows development of more diverse types of crystals, including crystals with varying degrees of nitrogen content for specialized purposes.

Silicon carbide is, however, a difficult material to work with because it can crystallize in over 150 polytypes, some of which are separated from one another by very small thermodynamic differences. Furthermore, because of silicon carbide's high melting point (over 2700° C. under high pressure), many processes for working silicon carbide, including epitaxial film deposition, often need to be carried out at much higher temperature than analogous reactions in other semiconductor materials.

In one sense the commercial or manufactured synthesis of silicon carbide—typically for use as an abrasive—has been carried out for well over a century, with growth of polycrystalline silicon carbide being recognized by Acheson in 1885. The genesis of growth for electronic purposes, however, was initiated much later, being generally attributed to the development of the "Lely" method (named after its inventor) in 1955. In 1978, the first seeded sublimation techniques, which are also referred to as modified Lely techniques, were carried out, and by the late 1980s, silicon carbide technology was being rapidly commercialized, primarily by the assignee of the present invention.

In a seeded sublimation technique, a seed crystal and a source powder are both placed in a reaction crucible which is heated to the sublimation temperature of the source and in a manner that produces a thermal gradient between the source and the marginally cooler seed crystal. The thermal gradient encourages vapor phase movement of materials from the source to the seed followed by condensation upon the seed and the resulting bulk crystal growth. The method is also referred to physical vapor transport (PVT).

In a typical silicon carbide growth technique, the crucible is made of graphite and is heated by induction or resistance, with the relevant coils and insulation being placed to establish and control the desired thermal gradients. The source powder is silicon carbide, as is the seed. The crucible is oriented vertically, with the source powder in the lower portions and the seed positioned at the top, typically on a seed holder; see U.S. Pat. No. 4,866,005 (reissued as No. RE34,861). These sources are exemplary, rather than limiting, descriptions of modern seeded sublimation growth techniques.

One typical and useful method for attaining high quality crystal growth is the epitaxial growth method in which a thin film of a semiconductor material is deposited upon a substrate of the same or a crystalgraphically similar material. In many circumstances, epitaxial growth is carried using chemical vapor deposition ("CVD"). This refers to the technique of introducing flowing source gases that contain the relevant elements into a reaction chamber in the presence of a suitable substrate under conditions of temperature, pressure and flow rate that encourage the source gases to react and form a high quality crystal of the desired material on the substrate.

For a number of reasons, the highest quality epitaxial layers (or "epilayers") of any given semiconductor material are generally best formed upon a substrate of the same material; e.g., silicon carbide epilayers on silicon carbide substrates. Doing so helps eliminate crystal lattice mismatches or other physical incongruence such as different coefficients of thermal expansion that are almost always necessarily present when two different, even if quite similar, materials are in contact with one another.

Accordingly, attaining suitable substrate materials for both epitaxial growth and for devices is a fundamental requirement in semiconductor device manufacture. As another factor, although epitaxial growth tends to produce high quality crystals, it proceeds very slowly. As a result, using epitaxial growth techniques to obtain bulk single crystals tends to be commercially unattractive even if physically possible.

Therefore, increasing the rate at which large single crystals of silicon carbide can be grown, increasing the diameter to which they can be grown, and reducing the defect density in the large crystals remain necessary and desired goals.

Although the density of structural defects in silicon carbide bulk crystals has been continually reduced in recent years, relatively high defect concentrations still appear and have been found to be difficult to eliminate. These can cause significant problems in limiting the performance characteristics of devices made on the substrates, or in some cases can preclude useful devices altogether. For example, a typical defect density in some commercially available silicon carbide wafers can be on the order of 100 per square centimeter (cm-2). A megawatt device formed in silicon carbide, however, will require a defect-free area on the order of 0.4 cm-2. Thus, obtaining large single crystals that can be used to fabricate large surface area devices for high-voltage, high current applications remains difficult.

Although occasionally named differently, the most common defects in silicon carbide bulk crystals are generally referred to as micropipes and hexagonal voids. A micropipe is a hollow core super-screw dislocation with its Burgers vector lying along the c-axis. A number of causes have been proposed or identified for the generation of micropipes. These include excess materials such as silicon or carbon inclusions, extrinsic impurities such as metal deposits, boundary defects, and the movement or slippage of partial dislocations. See e.g., Powell et al., Growth of Low Micropipe Density SiC Wafers, Materials Science Forum, Vols. 338-340, pp 437-440 (2000).

Hexagonal voids are flat, hexagonal platelet-shaped cavities in the crystal that often have hollow tubes trailing beneath them. Some evidence shows that micropipes are associated with hexagonal voids. A relatively recent discussion of such defects (exemplary and not limiting) is set forth in Kuhr et al., Hexagonal Voids and the Formation of Micropipes During SiC Sublimation Growth, Journal of Applied Physics, Volume 89, No. 8, page 4625 (April 2001).

Recent research indicates that problems in the bulk crystals produced in a seeded sublimation technique can originate with the seed itself and the manner in which it is physically handled; e.g., Sanchez et al., Formation of Thermal Decomposition Cavities in Physical Vapor Transport of Silicon Carbide, Journal of Electronic Materials, Volume 29, No. 3, page 347 (2000). Sanchez uses the term "micropipe" to describe, "approximately cylindrical voids with diameters in the range of 0.1 µm to 5 µm that form at the core of superscrew dislocations aligned parallel or nearly parallel to the [0001] axis" Id. at 347. Sanchez refers to larger voids ("diameters from 5 µm to 100 µm") as, "thermal decomposition cavities," and opines that micropipes and thermal decomposition cavities arise from different causes. Id.

Based on this hypothesis and his experimental work, Sanchez suggests that migration of "silicon rich vapor" from the back (opposite to growth) surface of a seed crystal into the growth system, causes thermal decomposition cavities that generate micropipes in the seed and then in the growing crystal. Sanchez suggests, "a continuous diffusion barrier for silicon bearing species," will reduce or eliminate such cavities. Sanchez describes a carbonized sucrose barrier for this purpose, but admits that the technique is, "not entirely reproducible." Id. at 352.

Accordingly, in order to continue to provide improvements in the quality of single crystal silicon carbide bulk crystals, and to reduce the defect density, the source of defects at the seed must be identified and successfully addressed.

SUMMARY

The invention is a single polytype single crystal silicon carbide wafer having a diameter greater than three inches and less than five inches, resistivity greater than 10,000 ohm-cm, a micropipe density less than 200 $cm^{-2}$ and a combined concentration of shallow level dopants less than 5E16 $cm^{-3}$.

DETAILED DESCRIPTION

Figure 1:
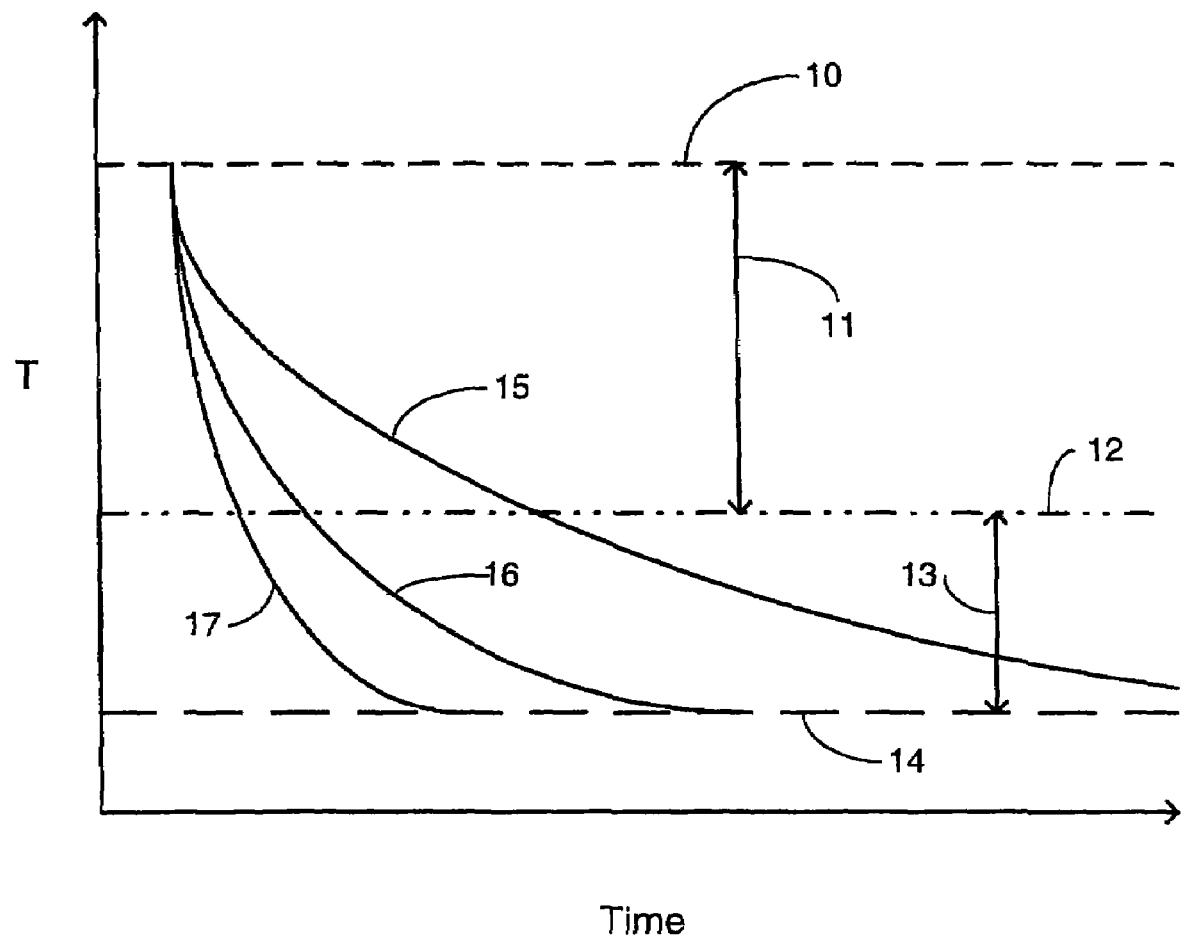
FIG. 1 is a schematic diagram illustrating the temperature ranges referred to in the detailed description and several different cooling rates.

The present invention is a silicon carbide wafer comprising a single polytype single crystal, a diameter greater than 3 inches and less than 5 inches, a resistivity greater than 10,000 ohm centimeters (Ω-cm), a micropipe density less than 200 per square centimeter ($cm^{-2}$), and a combined concentration of shallow level dopants less than 5E16 ($5 \times 10^{16}$) per cubic centimeter ($cm^{-3}$).

As well-understood by those of ordinary skill in this art, the term "single crystal" (or its equivalent, "monocrystalline"), particularly for crystals of the size described and claimed herein, is properly applied to such large crystals even when they contain small areas, regions or amounts of other polytypes of silicon carbide. Thus, large high-quality crystal wafers, in which a single polytype overwhelmingly predominates, are properly referred to herein as "single crystals."

In preferred embodiments, the wafer has a diameter of about 100 mm or 4 inches. As noted elsewhere herein, the relationship between metric units and English units is such that a 4 in. wafer will be 101.6 mm in diameter. Those of ordinary skill in this art recognize these factors, and will understand that the invention covers wafers that are exactly 100 mm in diameter, as well as those exactly 4 in. in diameter.

The wafers according to the present invention are suitable for high frequency power devices, high power devices, high temperature devices, optoelectronic devices, and Group III nitride deposition.

The wafers can be selected from the 3C, 4H, 6H and 15R polytypes of silicon carbide with the 4H polytype being presently most preferred. The wafers are available in an on-axis orientation or various off-axis orientations such as (but not limited to) 3.5°, 4°, and 8°. As one example, off-axis or off-orientation wafers can (but do not necessarily) refer to the angle between the projection of the normal vector to the surface onto a {0001} plane in the projection on that plane of the nearest <11-20> direction.

Wafers according to the invention have less than 200 micropipes per square centimeter ($cm^{-2}$), more preferably less than 100 micropipes per square centimeter, in more preferred embodiments less than 30 micropipes per square centimeter, and in low and ultra-low density, less than 15 and less than five micropipes per square centimeter respectively.

The wafers can include a single side polish with either the silicon or the carbon face ready for epitaxial growth or can be double side polished with either the silicon or the carbon face ready for the epitaxial growth. The wafers can be finished with a chemical mechanical polish with the silicon face epitaxial ready, or with a double side chemical mechanical polish with the silicon face epitaxial ready.

As used herein, the wafer's diameter refers to the linear dimension across the surface of away for width measurement performed manually with ANSI certified digital calipers on each individual wafer.

The thickness is measured at the center point with ANSI certified non-contact tools. The flatness is similarly measured with certified digital calipers on a sample of one wafer per ingot. For 100 mm wafers, the tolerance is within 0.015 in. (0.38 mm). Wafers according to the present invention have standard thicknesses of between about 350 and 700 (µm) depending on intended end use.

The off-axis surface orientation refers to the orientation of the surface of the wafer with respect to a crystallographic plane within the lattice structure. Surface orientation is measured with an x-ray goniometer on a sample of one wafer per ingot in the center of the wafer.

For commercial purposes, the wafers are available with both primary and secondary flats. As is conventional in semiconductor terminology, the primary flat represents the flat of the longest length on the wafer, oriented such that the court is parallel with a specified low index crystal plane. The primary flat is measured on one wafer per ingot using reflection techniques with manual angle measurements.

The secondary flat is the flat of shorter length than the primary flat and the position of the secondary flat with respect to the primary flat identifies the face of the wafer. In preferred embodiments, the carbon face of each individual wafer is laser marked with optical character recognition compatible fonts consistent with definitions and characteristics in the semiconductor industry.

Wafers according to the present invention can also comprise between one and five epitaxial layers on the surface and these layers are typically and preferably selected from the group consisting of silicon carbide and the Group III nitrides. The electronic properties and advantages of each of these types of materials are well recognized and well understood in this art, and thus will not be discussed further in detail herein.

The invention can accordingly include a device that incorporates the wafer and epitaxial layer as just described, and in most circumstances, a relatively large plurality of such devices will be formed on a wafer and potentially tested on the wafer before being separated into individual devices for end use.

The semi insulating silicon carbide wafer of the invention can provide an appropriate substrate for devices (depending on their particular design) such as FET's, MOSFET's, JFET's, MESFET's, HFET's, HEMT's, extended drain MOSFET's, and lateral DMOS transistors.

In its semi insulating characteristics, the wafer has a concentration of nitrogen atoms less than about $2\times10^{15}$ cm$^{-3}$ and a concentration of vanadium less than $1\times10^{14}$ cm$^{-3}$.

In preferred embodiments, the wafer has a resistivity of at least about 50,000 Ω-cm at room temperature.

As set forth in other parts of the discussion, the presence of point defects can affect the semi insulating characteristics, and thus in some embodiments, the wafer has a concentration of point defects that does not exceed $5\times10^{17}$ cm$^{-3}$.

In other embodiments, the wafer can comprise donor dopants, acceptor dopants, and intrinsic point defects. In one embodiment, the number of dopants of a first conductivity type is greater than the number of dopants of the other (second) conductivity type and the number of intrinsic point defects that act to compensate the predominating first type dopants is greater than the numerical difference by which the first type of doping predominates over the second type of doping, and with the concentration of transition elements the less than $1\times10^{16}$ cm$^{-3}$.

In preferred aspects of this embodiment, the first type dopants are donors, the second type dopants are acceptors, and the intrinsic point defects act as acceptors. Most preferably, the acceptors include boron. As in other embodiments, the concentration of vanadium in the wafer is preferably less than $1\times10^{14}$ cm$^{-3}$.

In another embodiment, the wafer of the invention includes nitrogen and at least one acceptor element having an electronic energy level of between 0.3 and 1.4 volts relative to the valence band of mono-crystalline silicon carbide, with the one acceptor element being present in an amount that overcompensates the nitrogen and pins the Fermi level of the silicon carbide substrate to the electronic energy level of the at least one acceptor element.

In another embodiment, the wafer includes an amount of electrically active nitrogen, an amount of electrically active point defects that act as acceptors, and an amount of at least one acceptor element having an electronic energy level of between 0.3 and 1.4 electron volts relative to the valence band of mono-crystalline silicon carbide, with the combined amount of the acceptor element and the point defects being greater than the amount of electrically active nitrogen and thus pin the Fermi level of the silicon carbide single crystal to the electronic energy level of the at least one acceptor element.

In another embodiment, the wafer according to the invention includes non-intentionally introduced nitrogen, scandium, and boron, and with the concentration of nitrogen being greater than the concentration of scandium and the concentration of boron being sufficient for the sum concentration of boron and scandium to overcompensate the nitrogen and pin the Fermi level of the silicon carbide to the level of the scandium.

A number of techniques enhance the production of wafers according to the present invention.

First, although the inventors do not wish to be bound by any particular theory, in one aspect an appropriate method can be best understood in a thermodynamic sense. As noted above, one object of the invention is to avoid the use of vanadium to produce semi-insulating character in silicon carbide. Instead, the present invention creates a sufficiently large concentration of point defect states in the silicon carbide so that the concentration remaining after normal semiconductor processing and device manufacture still exceeds the number necessary to produce semi-insulating character.

Those familiar with the nature of silicon carbide and the basis for semi-insulating characteristics will recognize that there is no specific number or concentration of point defects that meets this requirement. Instead, the goal is to minimize the concentration of other dopants (including point defects) in the lattice that could contribute to conductive characteristics, and then exceed that concentration with the concentration of items, in this case point defects and the resulting states they create, that create the desired semi-insulating characteristics.

Stated differently, in a compensated crystal the concentration of point defects that produce the desired deep level states and the resulting semi-insulating characteristics must be greater than the net concentration of the shallow compensating dopants. Thus, a semi-insulating compensated crystal of silicon carbide can have a relatively high concentration of both acceptor and donor atoms, provided that the number of point defects is in excess of the difference between those concentrations. This concentration of point defects can also be expressed as the concentration needed to exceed any uncompensated shallow dopants. It will be understood, of course, that the deep "levels" per se are not the compensating factors; i.e., deep donors do not compensate shallow donors. Instead, those of ordinary skill in this art recognize that deep acceptors compensate shallow donors and vice versa.

It has been generally found to be more efficient, however, to minimize the number of potentially compensating donor and acceptor atoms and thus minimize the number of point defects required to exceed the relevant numerical difference. For example (and for discussion purposes only), if the concentration of donor atoms were $2E^{17}$ ($2\times10^{17}$ cm$^{-3}$) and acceptor atoms 3E17 ($3\times10^{17}$ cm$^{-3}$), the concentration of point defects would have to be greater than 1E17 (i.e. 3E17 minus 2E17). Thus, minimizing the number (concentration) of donor and acceptor atoms is the preferred, although not necessary, manner of carrying out the present invention, because it reduces the number of states that need to be created to produce the semi- insulating character in the crystal.

In another aspect, the invention is a method of producing high quality semi-insulating silicon carbide crystals in the absence of relevant amounts of deep level trapping elements. In this aspect the invention comprises heating a silicon carbide crystal to a temperature above the temperature required for chemical vapor deposition (CVD) growth of silicon carbide from source gases, but less than the temperature at which disadvantageously high rates of silicon carbide sublimation occur under the ambient conditions to thereby thermodynamically increase the concentration of point defects and resulting states in the crystal.

The starting crystals are preferably of high purity and are produced by a seeded sublimation technique such as is set forth in U.S. Pat. RE34,861 (reissued from U.S. Pat. No.

4,866,005) or as discussed in Mueller, Status of SiC Bulk Growth from an Industrial Point of View, J. Crystal. Growth v. 211 No. 1 (2000) pp 325-332.

The method then comprises cooling the heated crystal to approach room temperature at a sufficiently rapid rate to maintain a concentration of point defects in the cooled crystal that remains greater than the first concentration.

Stated somewhat differently, the method comprises the step of cooling the heated crystal to approach room temperature at a sufficiently rapid rate to reduce the time spent in the temperature range in which the defects—including, but not limited to, those created by the heating step—are sufficiently mobile to be re-annealed into the crystal to thereby produce a silicon carbide crystal with a concentration of point defect-related deep level states that is greater than the concentration of such states in an otherwise identically grown silicon carbide crystal that has not been heated and cooled in this manner.

The silicon carbide can be heated in the form of a single crystal silicon carbide wafer or a single crystal silicon carbide boule (with a boule typically being defined as a single crystal structure). In the most preferred embodiments, the crystal has a polytype selected from the 3C, 4H, 6H and 15R polytypes of silicon carbide. In the more preferred embodiments, the method comprises heating and cooling a compensated silicon carbide crystal, and in most preferred embodiments comprises heating and cooling a compensated crystal in which the most concentrated dopant is present in an amount of about 5E16 or less. As set forth previously, when a compensated crystal is used, the method comprises heating and cooling a crystal to increase the number of point defects to an amount greater than the concentration of uncompensated shallow dopants. Under normal circumstances, the cooling step comprises cooling the heated crystal to room temperature. Thus, in another aspect, the invention is the semi-insulating silicon carbide crystal made by the method of the invention and its various embodiments.

In the preferred embodiments, the step of heating the silicon carbide crystal comprises heating the crystal to a temperature of at least about 2,000° C. Although 2000° C. is not an exact or necessary lower limit, the generation of point defects is assumed to be thermodynamically activated and thus probably includes an exponential relationship between temperature and the concentration of these defects. It has been observed that a preferred and useful number of point defects are generated at temperatures of 2,000° C. or higher.

In preferred embodiments, the crystal is heated to a temperature of between about 2,000° C. and 2,400° C. at atmospheric pressure. These temperatures provide a useful range at atmospheric pressure. At temperatures higher than 2400° C. the silicon carbide tends to sublime at undeniably high rates and thus temperatures above 2400° C. are less favored or disadvantageous at atmospheric pressure.

It will be understood by those familiar with the physical properties of silicon carbide that sublimation can occur over a relatively wide range of high temperatures. At lower portions of this range, the rate of sublimation is small enough to be of little or no concern. At higher portions of this range, however, the rate of sublimation will be high enough to be disadvantageous. Accordingly, the upper temperature limit of the method of the invention will to some extent be bounded by the subjective degree of sublimation found to be troublesome in particular circumstances. As noted above, at atmospheric pressure, 2400° C. has been found to be a convenient upper limit, but is not an absolute one.

The purpose of raising the temperature to 2000° C. or greater is a thermodynamic one: in a normally expected fashion, the entropy of the crystal is higher at higher temperatures, and thus, more of the point defects and resulting states that can produce semi-insulating character are present at higher temperatures. Additionally, those familiar with silicon carbide and the thermodynamics of crystals will recognize that as the temperature increases, additional types of states can exist that do not occur at lower temperatures. If the heated crystal is properly cooled in accordance with the present invention, these additional types of states can be preserved and will contribute to the desired semi-insulating properties.

Accordingly, heating the crystals to these temperatures creates a more disordered crystal, and the invention freezes (in a relative sense) these desired states in the crystals as the crystal is returned to room temperature. The cooling step is significant because if the crystal is allowed to spend too much time in intermediate temperature ranges, such as those above about 1400° C., the crystal will undergo the aforementioned annealing process, and can reach a different equilibrium or near-equilibrium condition in which the states disappear (or are functionally reduced to an irrelevant number) as the crystal becomes more ordered.

With respect to the preferred upper limit of 2400° C., it will be understood by those familiar with silicon carbide and crystal growth techniques that this is a practical limitation at atmospheric pressure rather than an absolute one. Stated differently, 2400° C. is a preferred upper temperature when using relatively typical equipment operating at atmospheric pressure. Those having the ordinary skill expected in this field could carry out the heating at higher temperatures without undue experimentation, but would have to add additional equipment and techniques such as incorporating an overlying silicon and carbon atmosphere or using some other high pressure technique to prevent the sublimation of silicon carbide that begins to occur in statistically significant amounts at such higher temperatures.

Thus, the method of the invention heats the crystal to a temperature as high as practical to produce as many states as possible in the crystal while avoiding or minimizing degradation or sublimation of the crystal.

During the heating step, the crystal is preferably maintained at the elevated temperature for a period of at least about two minutes, an interval that has practical and functional considerations. From a practical standpoint, it will take several minutes under most circumstances to heat the silicon carbide crystal to this temperature. From a functional standpoint, this also provides sufficient time for the crystal to reach an equilibrium or near equilibrium condition with respect to the states that are desirably generated. The heating time is presently functionally best expressed as a time sufficient to obtain a thermal equilibrium or near equilibrium in the crystal having the desired number of states. It will be understood that the crystal does not need to reach a full equilibrium in the most proper or restricted sense of that term, but the term is used herein to describe a condition in which the crystal reaches a given temperature and is maintained there for a time sufficient to develop the desired number of states.

The step of heating the crystal preferably comprises heating the crystal in an induction heater, in which case the step of cooling the crystal includes (at least) reducing the power to the induction coil. Induction heaters and their method of operation in semiconductor manufacture are generally well understood in the art and can be incorporated according to the invention without undue experimentation. Thus, as the particular induction heater is not critical to the claimed invention, it will not be discussed in detail otherwise herein. Additionally, other types of heating can be used by those of ordinary skill in this art and without undue experimentation.

Once the crystal has been heated for the desired period of time at the temperature of 2000° C. or above, it is cooled in a manner that avoids dwelling for any significant time period in the temperature range where the defects are mobile enough to disappear or to be re-annealed into the system. In presently preferred embodiments, a rate of cooling in excess of about 30° C. per minute appears to be preferred with a rate of 150° C. per minute appearing to be a useful upper limit.

It will be understood by those familiar with thermodynamics and the heating and cooling of materials, particularly materials at relatively high temperatures, that the rate of cooling need be neither constant nor exact throughout the entire cooling process. Stated differently, while the crystal is cooling, and particularly while it is cooling within temperature ranges where re-annealing can occur at significant rates, the rate of cooling should desirably range between the 30° C. per minute and 150° C. per minute preferred limits. For the usual and well-understood thermodynamic reasons, the heat loss and thus the rate of cooling will tend to be most rapid as the crystal cools from the highest temperatures and will tend to moderate as the crystal approaches and reaches lower temperatures. In particular, once the crystal is cooled below the temperature range in which re-annealing takes place at significant rates, the rate of cooling can become slower without any functional disadvantage. Accordingly, as an individual crystal is cooled, the rate at which it cools can vary within the 30°-150° C. per minute preferred range while still taking advantage of the method of the invention.

A rate of cooling that is too slow allows the crystal to spend too much time in the temperature range at which the states will heal and the crystal become sufficiently ordered to reduce the number of states below the number necessary to retain the semi-insulating characteristics. Alternatively, cooling at an overly-rapid rate can produce mechanical stresses in the crystal including fracturing if the thermal stress is sufficiently great.

In preferred embodiments the cooling step includes both passive and active steps. As a first step, the power to the induction heater is either reduced or turned off entirely. At the relatively high temperatures to which the crystal has been heated, the initial heat loss is a radiation heat loss. As the temperature becomes lower, the mechanisms of conduction and convection cooling take over. Accordingly, to further encourage and control the cooling rate, the heating chamber can be flooded with an inert gas, typically argon. Additionally, the thermal mass of the crystal and of the materials with which it is placed in contact can be used to help control the cooling rate. Consequently, three basic ways to control the rate of cooling include adjusting the power to the induction coil (or to any other relvant heating mechanism well understood in this art such as resistance heating); flowing a cooling gas around and over the silicon carbide crystal; and controlling the thermal mass of the crystal and its surroundings; i.e. such as the use of a heat sink. Because these are thermodynamic conditions, they can be addressed in a number of different ways that are not critical to the claimed invention and can be carried out by those of ordinary skill in this art without undue experimentation.

The preferred cooling rate of between about 30° and 150° C. per minute can be also expressed as cooling the crystal to about room temperature in less than about 70 minutes, or—at a more rapid pace—cooling the crystal to about room temperature in less than about 20 minutes.

Because the invention provides a beneficial semi-insulating silicon carbide crystal, including substrate wafers, the method of the invention can further comprise the steps of heating the silicon carbide substrate wafer to a temperature of about 2,000° C. (and preferably to between 2,000° and 2,400° C.), cooling the heated wafer to approach room temperature at a rate of at least about 30° C. per minute (and preferably approaching 150° C. per minute), and then depositing one or more epitaxial layers of semiconductor material on the substrate wafer. Because the advantage of silicon carbide often (although not exclusively) relates to its wide bandgap properties, in preferred embodiments, the step of depositing the epitaxial layer will comprise depositing an epitaxial layer selected from the group consisting of other wide bandgap semiconductors such as silicon carbide or Group III nitrides using chemical vapor deposition (CVD) techniques. In the case of silicon carbide, the step of depositing the epitaxial layer is typically carried out at temperatures greater than about 1,400° C. As noted above, in prior techniques steps carried out at such temperatures tended to reduce the number of defects to a point at which the substrate would no longer have appropriate semi-insulating characteristics. Because the invention provides a method for controllably increasing the number of point defects and resulting deep level states as compared to "as-grown" crystals, these later processing steps do not spoil the semi-insulating character of the crystal even though some of the defects are expected to heal.

Accordingly, in another aspect, the invention comprises the wafer and epitaxial layer(s) produced by this aspect and embodiment of the invention.

The invention can be carried out on substrate wafers or single crystal boules, with substrates being the preferred embodiment because their large surface-to-volume ratio enables them to cool at the relatively rapid rates that are useful in the invention without suffering undue or catastrophic thermal stress. Other than this practical point, however, there is no conceptual difference between the manner in which the additional states can be created in a wafer versus a boule. Accordingly, the invention can also comprise the steps of heating a silicon carbide boule to a temperature of at least about 2,000° C., then cooling the heated boule to approach room temperature at the rate of at least about 30° C. per minute, then slicing a silicon carbide wafer from the boule and then depositing one or more epitaxial layers of semiconductor material on the sliced wafer.

In an alternative embodiment, the method can comprise the steps of slicing the silicon carbide wafer from the single crystal boule, then heating the sliced wafer to the temperature of at least about 2,000° degrees C at atmospheric pressure, and then cooling the heated wafer to approach room temperature at a rate of at least 30° C. per minute, and thereafter depositing the epitaxial layer(s) of semiconductor material on the sliced wafer.

As known to those familiar with the preparation of substrate wafers and the growth of epitaxial layers, the sliced silicon carbide wafer is generally not used immediately after having been sliced, but instead is cleaned and polished to prepare a more favorable surface for epitaxial growth. The polishing and cleaning steps for semiconductor materials in general and silicon carbide in particular are well established in this art, can be practiced without undue experimentation, and will not be otherwise discussed in detail herein.

In either case, the invention further comprises the wafer and one or more epitaxial layers, and can further comprise devices that incorporate the wafer and epitaxial layers formed according to the methods of the embodiments of the invention.

The invention is not limited to use with any particular devices, but commonly used microwave devices that incorporate semi-insulating silicon carbide substrates include various types of field effect transistors (FETs), metal oxide semiconductor field effect transistors (MOSFETs), junction field effect transistors (JFETs), metal-semiconductor field effect transistors (MESFETs), heterostructure field effect transistors (HFETs), high electron mobility transistors (HEMTs), and DMOS transistors. Those familiar with semiconductor devices and devices useful for microwave frequency operation will recognize that this list is neither limiting nor exhaustive. It is, however, illustrative of the advantages provided by the invention described and claimed herein.

FIG. 1 schematically illustrates the temperature ranges and the cooling rates used in the present invention. Those familiar with these techniques will recognize that FIG. 1 is explanatory in nature rather than an exact representation of particular experiments.

FIG. 1 is a plot of temperature versus time. Three general sets of temperatures are characterized. The uppermost line designated at 10 represents the temperature, preferably 2,000° C. for silicon carbide, above which the desired number of point defects is produced in the manner according to the present invention. Stated differently, the invention includes the step of heating the silicon carbide crystal to the temperature represented by line 10 or higher.

The second highest line is designated at 12 and represents a lower temperature (which will be understood as relative rather than exact, but which in preferred embodiments is about 1200° C.) that together with the upper temperature line 10 defines a temperature range (represented by the arrow 11) within which the states created above the temperature line 10 will be expected to heal if the crystal is allowed to remain in this temperature range for a period of time sufficient to approach an equilibrium or a near equilibrium condition. Accordingly, the invention as described herein minimizes the time that the crystal spends in the temperature range 11 once the increased number of states has been produced. As noted above, maintaining the cooling rate at between about 30° C. and 150° C. per minute is particularly helpful while the crystal is within the temperature range schematically illustrated at 11 in FIG. 1.

The third line designated at 14 represents room temperature (25° C., 298 K) and defines another temperature range (designated by the arrow 13) between room temperature and the temperature line 12. The temperature range symbolized by the arrow 13 represents temperatures that are still above room temperature, but within which the amount of reordering that may occur is statistically insignificant to the semi-insulating characteristics.

For any number of reasons, the crystal normally can be expected to cool all the way to room temperature whether during pre-manufacture, storage, shipping or even use. It will be understood, however, that provided the crystal is heated to a temperature above that represented by the line 10, and then cooled sufficiently rapidly to a temperature below the temperature represented by the line 12, the benefits of the invention will be accomplished, regardless of whether room temperature is ever reached.

Three cooling curves are schematically illustrated as the lines at 15, 16, and 17. Because FIG. 1's abscissa represents time, it will be understood that the line 15 represents the slowest rate of cooling, while the line 17 represents the most rapid. In this sense, the extended curve 15 illustrates that the crystal would spend a much greater period of time in the temperature range designated by the arrow 11 as compared to crystals following the cooling curves designated by the lines at 16 or 17. Thus, the curve 15 schematically represents a prior art approach (intentional or unintentional) to cooling the crystal, while the lines 16 and 17 schematically represent the more rapid cooling steps of the present invention. As noted previously, provided the cooling rate meets the functional aspects described herein, the rate need not be constant.

Figure 2:
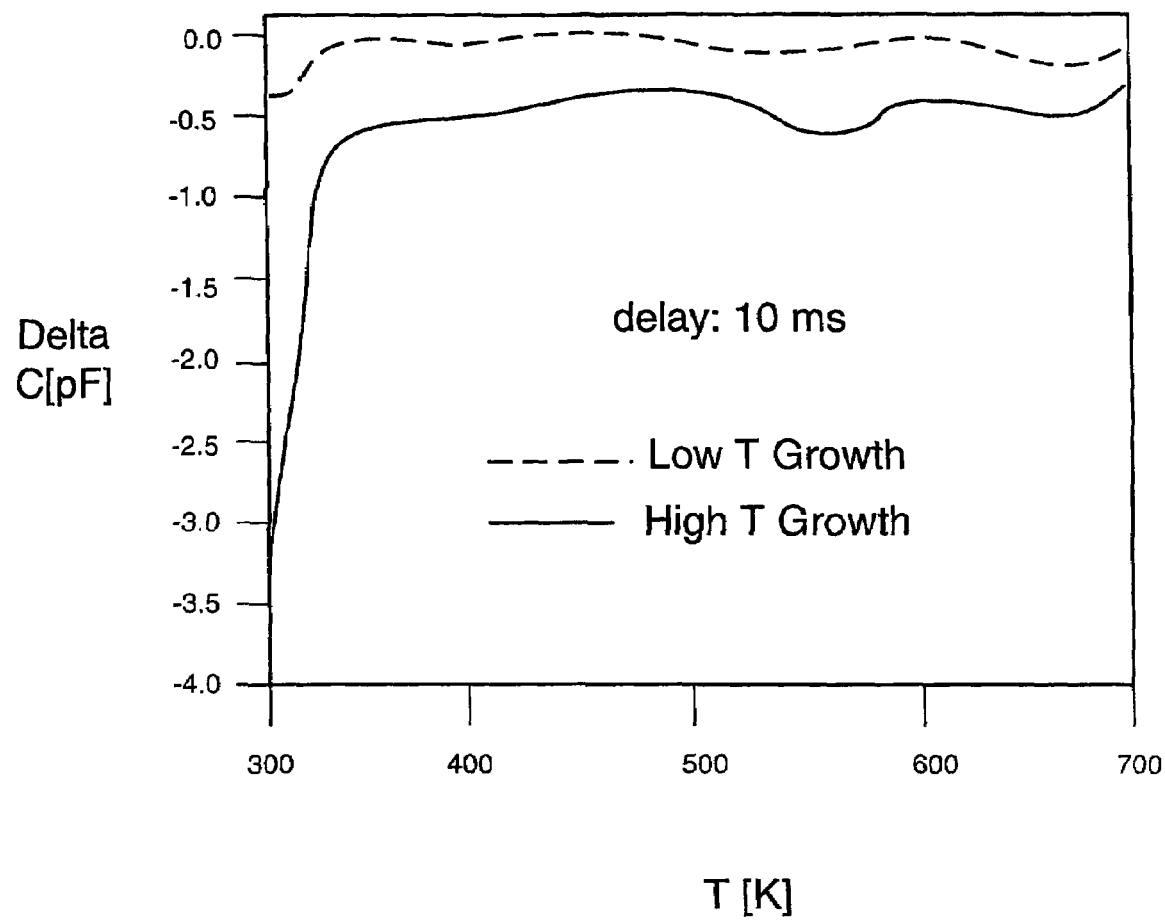
FIG. 2 is a plot of the change in capacitance against temperature in degrees Kelvin as measured by deep level transient spectroscopy (DLTS).

FIG. 2 illustrates that the desired high concentrations of deep-levels correlate with higher growth temperatures. FIG. 2 plots the change in capacitance as measured by deep level transient spectroscopy (DLTS) against temperature. The higher amplitude (e.g., at 300 K) of the crystal samples grown at higher temperatures (solid line) represents a larger concentration of deep levels as compared to a sample grown at a lower temperature (dashed line).

Deep level transient spectroscopy is generally well understood in the semiconductor arts and is a sensitive method used to study deep levels in semiconductors. The method is based on the capacitance charge of a reversed biased diode when deep levels emit their carriers after they have been charged by a forward bias pulse. The emission rate is temperature dependent and characteristic for each type of defect. Using the temperature dependence of the emission rate, the activation energy of a deep level can be determined. See, e.g., ASTM International Test No. F978-02, "Standard Test Method for Characterizing Semiconductor Deep Levels by Transient Capacitance Techniques." Other techniques for evaluating the crystal can include capacitance versus voltage (CV) techniques, as well as electron paramagnetic resonance (EPR).

Figure 3:
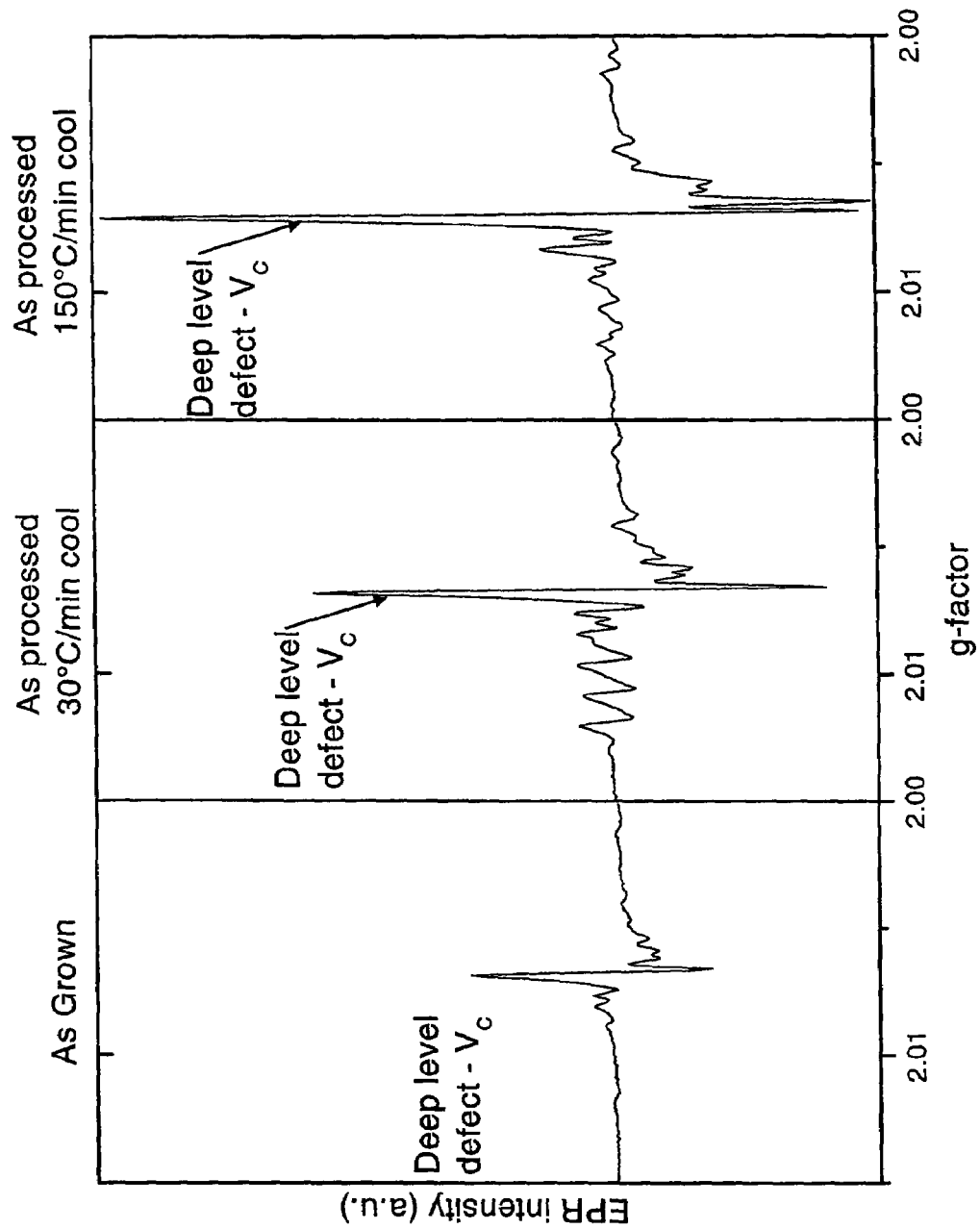
FIG. 3 is a comparative set of three plots from electron paramagnetic resonance (EPR) evaluation of silicon carbide crystal samples.

FIG. 3 is a comparative set of three plots from electron paramagnetic resonance (EPR) evaluation of silicon carbide crystal samples. EPR is a well-understood technique for measuring certain characteristics of materials and is also known as electron spin resonance (ESR) or electron magnetic resonance (EMR). EPR represents the process of resonance absorption of microwave radiation by paramagnetic ions or molecules, with at least one unpaired electron spin and in the presence of a magnetic field. In analyzing crystals according to the present invention, EPR is used to measure the number of charges occupying deep traps in the crystal bandgap. By measuring the change in absorption of microwave energy within a continuously varying strong magnetic field, EPR detects the number of unpaired spins of electronic charges trapped at various defects in the crystal lattice. The EPR measurement does not, however, evict the charges from the traps, but merely detects their presence, thus permitting repeated analysis of the same sample.

The three plots of FIG. 3 represent (from left to right), a silicon carbide crystal grown conventionally, a silicon carbide crystal heated and cooled in the range of 30° C. per minute according to the present invention and a crystal heated and cooled in the range of 150° C. per minute according to the present invention.

Each of the sections of FIG. 3 is sized identically and the magnitude (arbitrary units) of the EPR signal of the carbon vacancy ($V_c$)—i.e. one of the types of point defects that provides the states that in turn provide semi-insulating character—is proportional to the number of defect centers detected by the EPR. As known to those familiar with EPR, the "g-factor" (or "g-value") is characteristic of the type of electron trap and is related to the microwave frequency and the magnetic field strength. Accordingly, given that the sample sizes measured were the same within expected margins of experimental error, the magnitude of the EPR line for the carbon vacancies (from the trough to the peak) is proportional to the concentration of defects in the sample. Thus, FIG. 3 illustrates a significant increase in the number of carbon vacancies (and a resulting improvement in semi-insulating character) from the as-grown condition (left panel) to the process of the invention using a 30° C. rate of cooling (middle panel) to the process of the invention using a 150° C. rate of cooling (right hand panel).

In another aspect, the invention is a method of reducing the nitrogen content of a semi-insulating silicon carbide crystal grown by sublimation and a resulting high purity semi-insulating silicon carbide crystal with a reduced nitrogen concentration therein. One embodiment of the invention introduces a hydrogen or hydrogen-containing ambient atmosphere into a sublimation growth chamber used to grow silicon carbide crystals. Previously standard sublimation systems utilize an argon ambient in the growth of silicon carbide. The inventors herein have discovered that a hydrogen ambient is more useful than other ambient gases to control the nitrogen content of the growing crystal.

The method of the invention herein includes introducing a silicon carbide source powder and a silicon carbide seed crystal into a sublimation growth chamber. The source powder, as its name implies, provides a source of silicon carbide species in the growth chamber for growing a silicon carbide crystal on a growth surface provided by the silicon carbide seed crystal. U.S. Pat. No. Re. 34,861, the entire contents of which are incorporated by reference herein, sets forth that solid silicon carbide in powdered form is one such preferred source material. The method of the first embodiment includes heating the silicon carbide source powder to sublimation in a hydrogen ambient growth chamber. The hydrogen ambient of the sublimation growth chamber is established by introducing hydrogen gas into the growth chamber at a pressure of between about 0.1 and 50 Torr and at a flow rate of between about 10 and 1000 standard cubic centimeters per minute (sccm).

The sublimation process requires temperature control of different regions within the growth chamber. While heating the silicon carbide source powder to a first temperature, the silicon carbide seed crystal is heated and maintained at a second temperature approaching the temperature of the source powder. The temperature of the seed crystal is, therefore, lower than the temperature of the source powder and lower than that temperature at which silicon carbide will sublime. The reduced seed crystal temperature encourages sublimed species from the source powder to condense upon the seed crystal. The seed crystal, therefore, provides the growth surface for fabricating a silicon carbide crystal with desired dimensions. The method herein includes a continued heating of the silicon carbide source powder until a desired amount of silicon carbide crystal growth has occurred upon the seed crystal.

The seed crystal preferably has a polytype selected from among the 3C, 4H, 6H and 15R polytypes of silicon carbide, depending on the polytype desired in the resulting grown crystal. The silicon carbide species that condense onto the seed crystal optimally grow a silicon carbide crystal with the same polytype as the seed crystal.

The invention maintains a thermal gradient between the growth surface of the seed crystal and the source powder. Re. 34,861 describes various means for maintaining a thermal gradient between the source powder and the seed crystal. The gradient may be accomplished, for example, by establishing a desired geometric distance and temperature difference between the seed crystal and the source powder. Otherwise, the temperature gradient may be established by independently controlling the temperatures of the respective regions within the growth chamber in which the silicon carbide powder sublimes and the silicon carbide crystal grows.

Typically, the silicon carbide source powder is maintained at a temperature of between about 2000° C. and 2500° C. The seed crystal, in turn, is maintained at a temperature of between about 50° C. and 350° C. lower than the temperature of the source powder.

The method herein further includes maintaining the source powder and the seed crystal during sublimation growth at respective temperatures high enough to increase the number of point defects in the growing crystal. The point defects, in conjunction with lower nitrogen content, render the resulting silicon carbide crystal semi-insulating.

Alternatively, the step of increasing the number of point defects can comprise the previously described method of heating a silicon carbide crystal to a temperature above the temperatures required for CVD growth of silicon carbide from source gases, but less than the temperatures at which disadvantageously high rates of silicon carbide sublimation occur under the ambient conditions to thereby thermodynamically increase the concentration (i.e., number per unit volume) of point defects and resulting states in the crystal; and then cooling the heated crystal to approach room temperature at a sufficiently rapid rate to minimize the time spent in the temperature range in which the defects are sufficiently mobile to disappear or be re-annealed into the crystal to thereby produce a silicon carbide crystal with a concentration of point defect states that is greater than the concentration of point defect states in an otherwise identically grown silicon carbide crystal that has not been heated and cooled in this manner.

The method described and claimed herein allows the production of semi-insulating silicon carbide crystals without the need for deep level doping elements, such as vanadium. As discussed in commonly assigned U.S. Pat. No. 6,218,680, prior art methods of fabricating semi-insulating silicon carbide incorporate dopants that form energy states at levels between the valence and conduction bands of silicon carbide. These energy states of the prior art are far removed from both the conduction band and the valence band to enhance the semi-insulating qualities of the crystal. Common deep level trapping elements incorporated into silicon carbide include vanadium and other transition metals. The method herein allows the fabrication of semi-insulating silicon carbide crystals without relying upon more complicated doping levels that may be quite difficult to accurately control.

The method developed by the inventors herein allows for deep level trapping elements in the silicon carbide source powder to be kept to minimum levels, thereby simplifying the fabrication process. The deep level trapping elements in the silicon carbide source powder are referred to herein as being present in amounts that are "below detectable levels," meaning that the elements are present in amounts that cannot be detected by modern sophisticated analytical techniques.

In particular, because one of the more common techniques for detecting elements in small amounts is secondary ion mass spectroscopy ("SIMS"), the detectable limits referred to herein are those amounts of elements such as vanadium and other transition metals that are present in amounts less than $1 \times 10^{16}$ (1E16), or in other cases (including vanadium), less than 1E14. These two amounts represent typical detection limits for most trace elements (particularly vanadium) using SIMS techniques; e.g., SIMS Theory—Sensitivity and Detection Limits, Charles Evans & Associates (1995), www.cea.com.

The method described and claimed herein helps control the amount of nitrogen incorporated into the growing silicon carbide crystal by controlling the hydrogen concentration in the ambient atmosphere of the growth chamber. Although the inventors do not wish to be bound by any particular theory, the effectiveness of the hydrogen on suppressing the nitrogen in the crystal is attributed to the passivation of the silicon carbide growth surface by hydrogen atoms. The hydrogen atoms, in effect, block, reduce, or otherwise hinder the incorporation of nitrogen atoms at the surface of the growing crystal.

The method of the invention herein, therefore, is appropriately described in another embodiment as a method of passivating a growing silicon carbide crystal in a sublimation growth chamber to control the nitrogen that can be incorporated into the crystal. A second embodiment of the invented method includes introducing an ambient gas containing hydrogen into the growth chamber and heating a silicon carbide source powder to sublimation in the hydrogen ambient growth chamber. The source powder is heated while simultaneously heating and maintaining a silicon carbide seed crystal in the hydrogen ambient growth chamber to a second temperature below the temperature of the source powder. The temperature of the seed crystal is low enough for sublimed species from the source powder to condense upon the seed crystal.

The hydrogen passivation method, furthermore, maintains the source powder and the seed crystal during sublimation growth at respective temperatures high enough to increase the number of point defects in the growing crystal. The point defects assist in rendering the resulting silicon carbide crystal semi-insulating. The heating, sublimation, and condensation steps continue at sufficiently high temperatures to induce a sufficient number of point defects for a semi-insulating crystal. The overall silicon carbide deposition continues until a desired amount of highly pure semi-insulating silicon carbide crystal grows upon the seed crystal.

An ambient concentration of hydrogen is maintained in the growth chamber sufficient to passivate the growing silicon carbide crystal against the incorporation of nitrogen. The hydrogen passivation thereby controls the amount of nitrogen incorporated into the growing silicon carbide crystal. The inventors do not wish to be bound by any particular theory, but research in the field of sublimation grown silicon carbide crystals suggests that the hydrogen atoms in the ambient atmosphere of the growth chamber reduce the number of unpaired electrons in the silicon carbide crystal. U.S. Pat. No. 5,151,384, issued to Williams and incorporated by reference herein, describes and claims the electron pairing of hydrogen passivation on silicon compounds at column 2, lines 38-70. This reduction of unpaired electrons corresponds to a reduced number of nitrogen atoms likely to bond with the silicon carbide crystal as it grows.

Alternative explanations also exist to explain the physical mechanism by which the hydrogen ambient suppresses nitrogen incorporation. One explanation is that the hydrogen passivation of the silicon carbide crystal is essentially a layer of hydrogen atoms on the crystal growth surface that protects the surface from nitrogen incorporation. See, e.g., U.S. Pat. No. 5,709,745 (col. 26, lines 18-24); U.S. Pat. No. 6,113,451 (col. 8, lines 38-44); and U.S. Pat. No. 6,201,342 (col. 8, lines 33-39), all of which are incorporated entirely by reference herein.

Finally, published European Patent Application 0561462A2 (col. 10, lines 42-48) filed on Mar. 12, 1993 describes hydrogen passivation as filling in spaces between the silicon carbide crystal grain boundaries and disallowing nitrogen incorporation therein. The inventors do not rely on any particular one of these descriptions of the effects of hydrogen in silicon carbide growth. The method disclosed and claimed herein successfully controls nitrogen content by a combination of these physical and chemical interactions between the hydrogen atoms and the growing silicon carbide crystal. The method results in a desirable highly pure, semi-insulating silicon carbide crystal growth.

Controlling the hydrogen flow rate into the growth chamber between about 80 and 1000 standard cubic centimeters per minute (sccm) at a pressure of between about 0.1 and 50 Torr provides a sufficient hydrogen concentration in the growth chamber to yield the desired crystal. The method has proven successful in fabricating a silicon carbide crystal with less than about $2 \times 10^{15}$ nitrogen atoms per cubic centimeter ($cm^{-3}$). In preferred practice, the hydrogen concentration in the ambient atmosphere yields a silicon carbide crystal with less than about $1 \times 10^{15}$ $cm^{-3}$ nitrogen atoms. The low nitrogen concentration of the resulting silicon carbide crystals, coupled with the deep levels, yields a resistivity greater than or equal to $1 \times 10^5$ ohm-cm.

The invention claimed herein is useful in a variety of other applications. For example, synthesizing high purity silicon carbide powder in a hydrogen containing environment potentially reduces nitrogen content in the source powder. The technique is also useful in the manufacture of near colorless gemstone material. Finally, the control of nitrogen incorporation in a silicon carbide crystal represents an advancement in the manufacture of semi-insulating crystals and wafers of silicon carbide used in the manufacture of MESFET and HEMT high frequency electronic devices. The technique disclosed herein provides an efficient and straight forward method of achieving extremely low nitrogen levels in silicon carbide crystals and wafers. In fact, bulk wafers having extremely low concentrations of nitrogen may be produced by controlling the nitrogen content of a growing crystal. Wafers made from these crystals may displace the need for the thick high purity epitaxial layers grown on current silicon carbide substrates.

Figure 4:
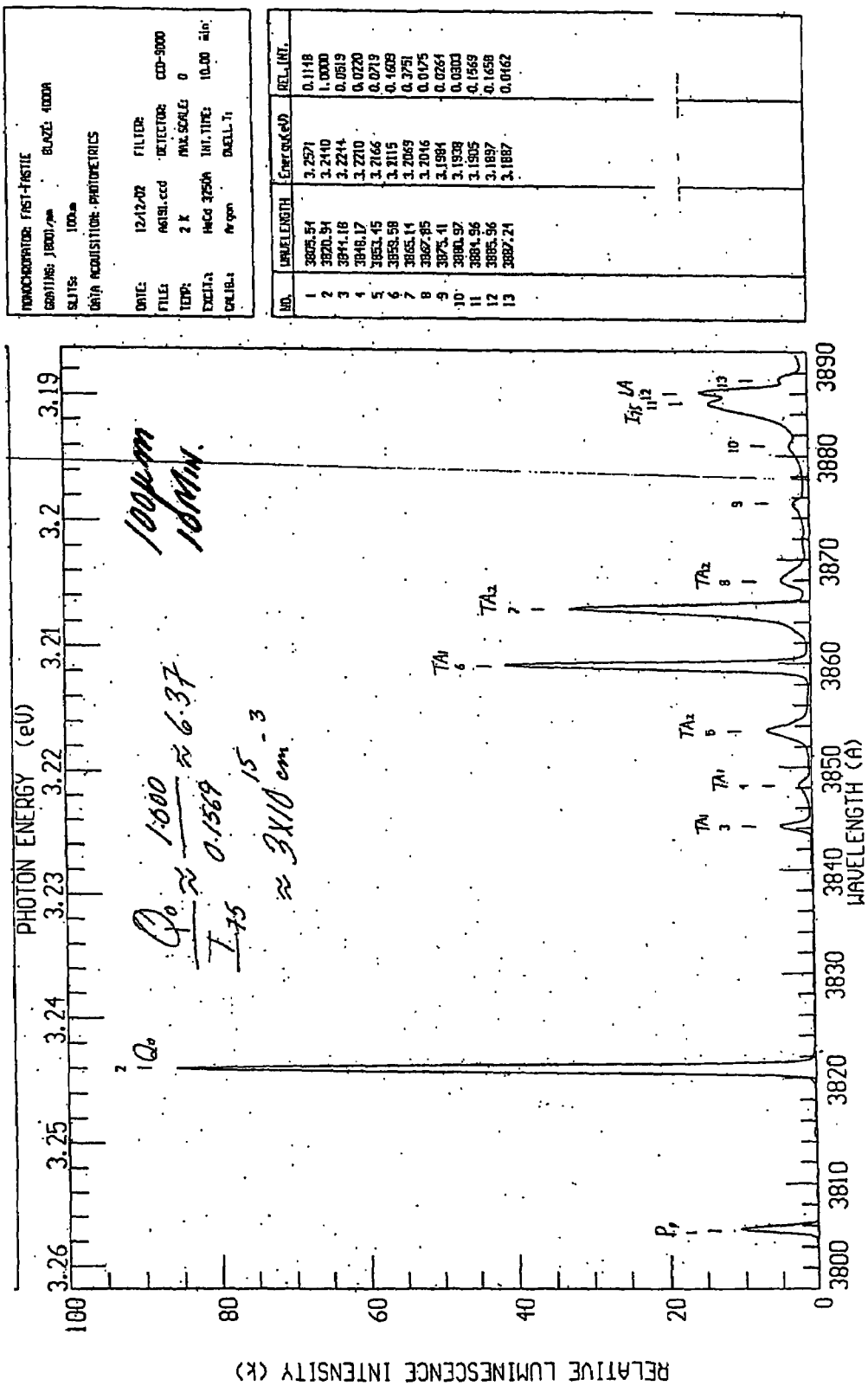
FIG. 4 shows the low temperature photoluminescence spectrum corresponding to a 4H-silicon carbide crystal grown in a conventional argon ambient of the prior art.
Figure 5:
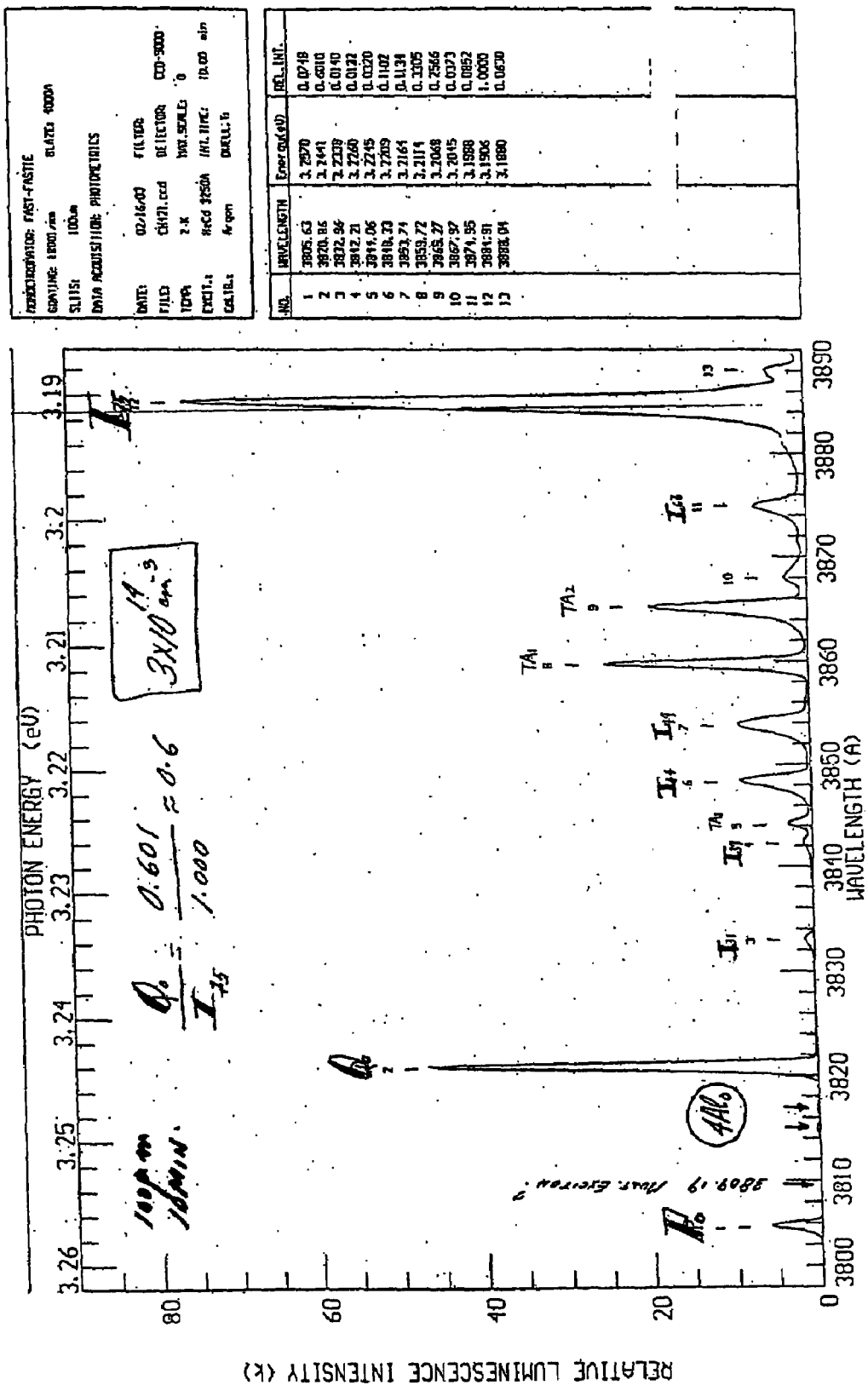
FIG. 5 shows the low temperature photoluminescence spectrum corresponding to a 4H-silicon carbide crystal grown in a hydrogen ambient according to the invention herein.

FIGS. 4 and 5 illustrate that the invention described and claimed herein presents a significant advancement in the field of growing highly pure, semi-insulating silicon carbide crystals by sublimation. The hydrogen ambient controls the nitrogen incorporated into the crystal and provides a more reliable semi-insulating silicon carbide crystal quality. FIG. 4 shows the low temperature photoluminescence spectrum corresponding to a 4H-silicon carbide crystal grown in a conventional argon ambient. FIG. 5 shows the low temperature photoluminescence spectrum corresponding to a 4H-silicon carbide crystal grown in a hydrogen ambient according to the invention herein.

A background discussion is helpful in understanding the advantages illustrated by FIGS. 4 and 5. The figures plot the photoluminescence spectra for silicon carbide crystals and show luminescent intensity peaks at specific wavelengths. These peaks of luminescence are proportionally related to the nitrogen content of the silicon carbide crystal under consideration. See Ivanov et al., Nitrogen Doping Concentration as determined by Photoluminescence in 4H- and 6H- SiC, Journal of Applied Physics, vol. 80, no. 6, Sep. 15, 1996, pp. 3504-3508. The nitrogen concentration in a crystal can be determined by the luminescence of electrons and holes during their recombination at neutral nitrogen centers.

In the study of electron-hole recombinations, silicon carbide is known as an indirect bandgap semiconductor. As known to those familiar with electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the crystal.

The indirect band gap of silicon carbide prevents the direct recombination of holes and electrons. The direct non-phonon assisted recombination of a free exciton, independent of other particles, is therefore forbidden. The recombination of electrons and holes in silicon carbide requires the formation of the previously discussed phonon to account for the difference in momentum between recombined electrons and holes.

Ivanov et al. reported in 1996 that the electron-hole exciton may be coupled to a phonon or bound to an impurity in the crystal to account for the required conservation of momentum. The luminescence intensity of the recombination is dependent upon whether the recombined electron-hole pair is bound to a phonon or to an impurity, such as nitrogen. See Ivanov et al., supra., pp. 3504-3508. Ivanov et al., therefore, show that the concentration of impurity in a crystal can be determined by comparing the luminescence intensity of an electron-hole recombination paired with an impurity and the luminescence intensity of an electron-hole recombination paired with a phonon.

FIGS. 4 and 5 herein illustrate these concepts and show the success of the nitrogen reduction method of the present invention. The figures plot the relative luminescence intensity versus wavelength for 4H silicon carbide crystals. The peak luminescence intensity is shown as Q0 and corresponds to the intensity of an electron-hole recombination bound to a nitrogen atom as an impurity in the crystal. Less intense peaks of luminescence in the figures correspond to phonon coupled recombinations, the most significant of which for purposes herein is the recombination marked I75. I75 is the highest intensity phonon-assisted recombination and can be identified by its asymmetric line shape (Ivanov, supra at 3505). As known to those in the art, the ratio of Q0 to I75 yields a constant that can be used to extrapolate the nitrogen content of the subject silicon carbide crystal (Ivanov, supra at 3508).

Considering FIG. 4, the luminescence intensity is plotted for a 4H silicon carbide crystal grown by sublimation in a traditional argon ambient atmosphere. FIG. 4 is, therefore, indicative of prior art in the area of silicon carbide grown by sublimation. The extrapolated nitrogen content is approximately $3 \times 10^{15}$ nitrogen atoms per cubic centimeter of the resulting silicon carbide crystal.

FIG. 5 shows the luminescence data corresponding to a crystal grown in a hydrogen ambient atmosphere by the invention disclosed herein. As can be seen in the spectrum, the ratio of Q0 to I75 is at 0.6, corresponding to a nitrogen concentration in the crystal of $3 \times 10^{14}$ nitrogen atoms per cubic centimeter. The data of FIG. 5 shows that the presence of a hydrogen ambient in the sublimation growth chamber reduced the nitrogen content in the crystal by approximately one order of magnitude. FIG. 5 shows, therefore, that the hydrogen concentration in the growth chamber ambient can be used to reduce the nitrogen content of the resulting silicon carbide crystal grown therein. The resulting low nitrogen crystal is a high purity semi-insulating crystal as desired.

In yet another aspect, the method of the present invention helps to control the amount of nitrogen incorporated into the growing silicon carbide crystal by controlling the hydrogen concentration in the ambient atmosphere of the growth chamber. The hydrogen atoms, in effect, block, reduce, or otherwise hinder the incorporation of nitrogen atoms at the surface of the growing crystal. Although the inventors do not wish to be bound by any particular theory, the effectiveness of the hydrogen on controlling the nitrogen in the crystal is attributed to two principal mechanisms. The first possible mechanism induced by the presence of the hydrogen is a reduction in the number of carbon -vacancy sites where nitrogen atoms can reside in the SiC crystal lattice. This reduction in carbon vacancies derives from a shift in the crystal composition toward carbon-richness due to the effect of hydrogen on the silicon to carbon ratio of molecular species emanating from the SiC sublimation source. [This mechanism is described from a theoretical point of view in several papers treating the thermodynamics of the SiC-H2 system ( see for example: Lilov et al., J. Crystal Growth 32 (1976) 170, Studies of Growth Processes in Silicon Carbide Epitaxial Layers from the Vapor Phase; and Rabeck et al., J. Electrochem. Soc. 144 (1997) 1024 Thermodynamic Considerations of the Role of Hydrogen in Sublimation Growth of Silicon Carbide)]. Since nitrogen is incorporated on the carbon sub-lattice at carbon-vacancy sites, the amount of incorporated nitrogen is reduced when the concentration of carbon vacancies is reduced.

The second possible mechanism is a passivation mechanism in which the silicon carbide growth surface is directly passivated by the hydrogen atoms thereby preventing or otherwise hindering the incorporation of the nitrogen.

The method of the invention herein, therefore, is appropriately described in another embodiment as a method of passivating a growing silicon carbide crystal in a sublimation growth chamber to control the nitrogen that can be incorporated into the crystal. A second embodiment of the invented method includes introducing an ambient gas containing hydrogen into the growth chamber and heating a silicon carbide source powder to sublimation in the hydrogen ambient growth chamber. The source powder is heated while simultaneously heating and maintaining a silicon carbide seed crystal in the hydrogen ambient growth chamber to a second temperature below the temperature of the source powder. The temperature of the seed crystal is low enough for sublimed species from the source powder to condense upon the seed crystal. The heating, sublimation, and condensation steps are continued until a desired amount of silicon carbide crystal growth has occurred upon the seed crystal. An ambient concentration of hydrogen is maintained in the growth chamber sufficient to passivate the growing silicon carbide crystal against the incorporation of nitrogen and to thereby control the amount of nitrogen incorporated into the growing silicon carbide crystal.

The inventors do not wish to be bound by any particular theory, but research in the field of sublimation grown silicon carbide crystals suggests that the hydrogen atoms in the ambient atmosphere of the growth chamber reduce the number of unpaired electrons in the silicon carbide crystal. U.S. Pat. No. 5,151,384, issued to Williams and incorporated by reference herein, describes and claims the electron pairing of hydrogen passivation on silicon compounds at column 2, lines 38-70. This type of reduction of unpaired electrons corresponds to a reduced number of nitrogen atoms likely to bond with the silicon carbide crystal as it grows.

The hydrogen ambient may be established within the growth chamber by the direct flow of hydrogen, as noted above. Alternatively, a hydrocarbon species, such as methane, may be introduced into the growth chamber instead of pure hydrogen. A similar effect on nitrogen reduction in the growing crystal occurs because the hydrocarbon species tend to crack at high growth temperatures used during sublimation. The cracked hydrocarbon species principally produce hydrogen, which would then have the same effects as a pure hydrogen ambient in the growth chamber. Any hydrocarbon can serve this purpose provided it supplies the hydrogen without otherwise interfering with the source powder, the seed, the growing crystal, the growth process or the equipment.

In yet another aspect, the invention can be described in terms of the sublimation growth of silicon carbide, but is not limited to silicon carbide per se.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

Figure 6:
FIGS. 6 and 7 are micrographs reproduced from scientific papers in this field, both of which illustrate micropipes in silicon carbide.

FIG. 6 is a micrograph of a micropipe-caused failure in a silicon carbide device (V. Dmitriev et al., Large Area Silicon Carbide Devices Fabricated on SiC Wafers with Reduced Micropipe Density, Materials Science and Engineering B61-62 (1999) 446-449).

Figure 7:
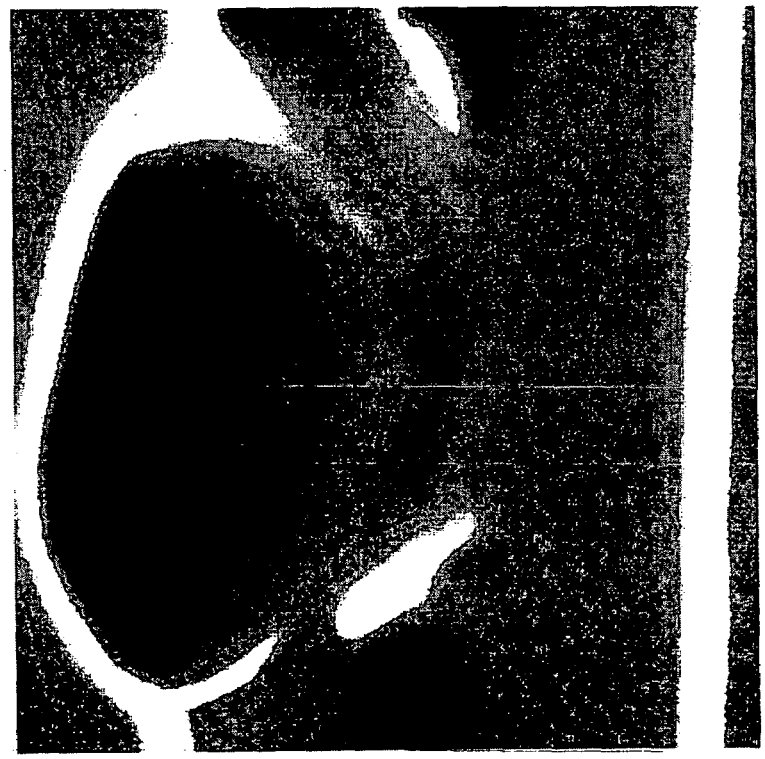

FIG. 7 is another micrograph of a micropipe as set forth by Bakin et al., State of the Art in Defect Control of Bulk SiC, Invited Talk at the 1998 High Temperature Electronic Materials, Devices and Sensors Conference (1998), San Diego, Calif., pp. 2-13. FIGS. 1 and 2 are included for illustration purposes and to provide context to the invention.

As noted in the Background, recent thinking hypothesizes that unintended sublimation from the rear (opposite to growth) face of the seed crystal initiates micropipe defects that propagate through the seed and thereafter into the growing crystal. From a functional standpoint, the goal is to maintain a proper growth shape throughout the entire growth cycle while minimizing or eliminating relevant defects such as micropipes.

Although such effects are addressed herein, the present invention also includes the recognition that other (or in some cases most) micropipe defects do not necessarily initiate in the seed, but rather in the growing crystal during the early stages of its growth. In turn, the invention incorporates the recognition that the physical relationship between and among the seed crystal and the seed holder similarly affects the degree to which defects form—or are prevented from forming—in the growing crystal.

In turn, the invention incorporates the recognition that inconsistent thermal circumstances at the interface of the seed crystal and the seed holder tend to generate changes in growth that can be, and often are, manifested as micropipe defects in the growing crystal. Accordingly, the invention provides various techniques for ensuring a consistent thermal relationship between the seed crystal and the seed holder.

Stated differently, if the temperature profile across the seed-seed holder interface is inconsistent, such thermal differences can conductively affect the growth interface between the seed and the growing crystal. The resulting thermal inconsistencies at the seed-growth interface have been found to encourage the initiation and propagation of micropipe defects in the growing bulk crystal.

In one aspect of the invention, providing the consistent thermal circumstances is achieved by minimizing the separation of the seed and the seed holder to ensure that conductive heat transfer exceeds, and preferably dominates, radiative heat transfer over substantially the entire area between the seed and the seed holder. In particular, it has been discovered according to the present invention that superior results are achieved when the seed crystal and seed holder are in macroscopic direct contact and that their respective contacting surfaces always conform to one another within 10 μm or less, more preferably 5 μm or less, and most preferably 2 μm or less, including less than one μpm wherever possible.

In turn, such a relationship can be fostered by using a seed crystal that deviates from flat by no more than 10 μm, more preferably no more than 5 μm and most preferably less than 2 μm and potentially less than 1 μm.

Furthermore, using a seed holder that deviates from flat by no more than 10 μm is likewise preferable to obtain the desired relationship. As in the case of the seed, the deviation is preferably no more than 5 μm and most preferably less than 2 μm and potentially less than 1 μm . Additionally, the seed crystals should be internally homogeneous.

These tolerances are at least an order of magnitude more accurate than those generally recognized in the art as being necessary for such purposes. For example, a silicon wafer of three-inch (3") diameter is considered acceptable if it has a total thickness variation (TTV) of 25 μm, a maximum bow of 40 μm, and a maximum warp of 40 μm (e.g., SEMI M1.2-89, "Standard for 3 inch Polished Monocrystalline Silicon Wafers, SEMI 1978, 1999).

As used herein, the term "bow" refers to the bending of the wafer into a curve; i.e., the deviation of the center point from the average position of the surface. In slight contrast, the term "warp" refers to a twisting or turning of the wafer away from its desired flat shape; i.e., the largest "peak" to "valley" distance across the wafer.

Obtaining the desired conformity between the seed and the seed holder can be enhanced by a number of techniques. It will be understood that from a theoretical perspective, the seed and seed holder can be any respective shapes provided that they conform within the 10 μm tolerance. In most circumstances, however, the most straightforward method of obtaining the desired conformity is to make both items as flat as possible.

Thus, in one aspect the method comprises using a relatively thick seed crystal; i.e., on the order of about 1.4 mm rather than the more conventional 600-700 μm for a three-inch seed crystal. The thicker seed offers several advantages in the method of the invention. First, because increased thickness correspondingly increases the mass of the seed, the seed has a greater total heat capacity and can more efficiently moderate temperature differences that originate at the seed holder and present the growing seed with a lesser thermal inconsistency than exists at the seed-seed holder interface. The high thermal conductivity of silicon carbide also helps moderate temperature differences more quickly and evenly in larger (i.e., proportionally thicker) seeds than in thinner ones.

Second, a thicker seed can be polished more readily. Polishing the seed offers at least two advantages in the invention. First, it helps reach the flatness tolerances noted above. Second, polishing helps reduce or eliminate subsurface damage that may be present in the seed crystal. According to the invention, it has been discovered that if such subsurface damage remains in the seed, the high growth temperatures used for silicon carbide will tend to anneal (repair) such damage at high temperature. The annealed crystal then tends to experience mechanical relaxation in the absence of the mechanical stress caused by the subsurface damage at room temperature. In turn, the relaxed crystal tends to change shape, which in turn tends to produce the undesired and problematic thermal inconsistencies.

Stated differently, if the seed is flat at room temperature in the presence of the stress produced by any subsurface defects, annealing the seed will relax the stress and thus cause the wafer to deviate from flat.

As a third advantage, at any given diameter a thicker seed simply tends to bend less at any temperature, including growth temperatures, all other factors being equal.

In another aspect, the method can comprise double side lapping of the seed wafer to machine it to a flat shape exhibiting a deviation from flat of less than 10 μm, more preferably less than 5 μm and most preferably 2 μm or less. Alternatively, the wafer can be machined to a shape conforming to the shape of the seed holder for the same purpose. Other equivalent methods can also be incorporated such as grinding or polishing. As stated above, the goal is to produce a seed over which there is no more than 10 μm deviation from flat at any point.

Figure 8:
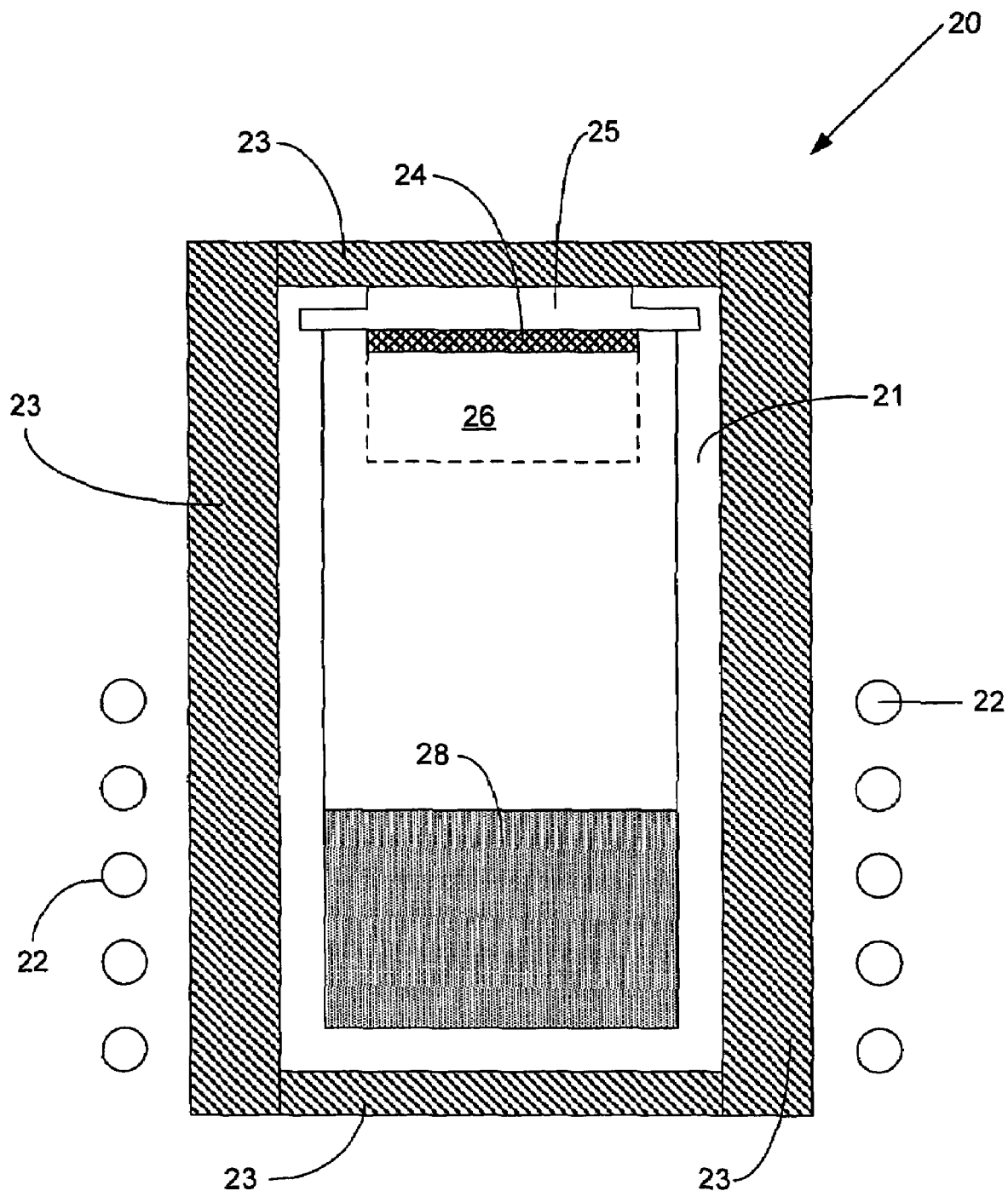
FIG. 8 is a cross-sectional schematic view of a conventional sublimation growth system for silicon carbide.

FIG. 8 is a cross sectional schematic diagram of a sublimation system for seeded sublimation growth of the type for which the invention provides several improvements. The system is broadly designated at 20. As in most typical systems, the system 20 includes a graphite susceptor 21 and a plurality of induction coils 22 that heat the susceptor 21 when current is applied through the coils 22. Alternatively, some systems incorporate resistance heating. It will be understood by those familiar with these crystal growth techniques that the system can be further enclosed in some circumstances, e.g., in a water-cooled quartz vessel. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 21 is typically surrounded by insulation, several portions of which are illustrated at 23 in FIG. 8. Although FIG. 8 illustrates the insulation as being generally consistent in size and placement, it will be understood and is recognized by those of skill in the art that the placement and amount of the insulation 23 can be used to provide desired thermal gradients (both axially and radially) along the susceptor 21. Again, for purposes of simplification, these possible permutations are not illustrated herein.

The susceptor 21 includes one or more portions for containing a silicon carbide powder source 28. Such a powder source is most commonly—although not exclusively—used in seeded sublimation growth techniques for silicon carbide. FIG. 8 illustrates the powder source as being contained in a lower portion of the susceptor 21 and this is one typical arrangement. As another familiar variation, some systems distribute the source powder in a vertical, cylindrical arrangement in which the source powder surrounds a larger portion of the interior of the susceptor than does the arrangement illustrated in FIG. 8. The invention described herein can be appropriately used in both types of equipment.

The seed crystal of silicon carbide is designated at 24, and is typically placed in upper portions of the susceptor 21. A seed holder 25 is typically used to hold the seed 24 in place with the seed holder 25 being attached to the susceptor in an appropriate fashion. This can include various resting or threaded arrangements. In the orientation illustrated in FIG. 3, the upper portions of the seed holder 25 would typically include threads as would the uppermost portions of the graphite susceptor 21 so that the seed holder 25 could be threaded into the top of the susceptor 21 to hold the seed 24 in the desired position. The growing crystal is illustrated by the dotted rectangle designated 26.

The general scheme for sublimation growth is set forth briefly in the Background portion of the specification as well as in a number of the references already referred to herein, and in other sources well-known to those of ordinary skill in this art. Typically, an electric current, having a frequency to which the susceptor 21 responds, is passed through the induction coils 22 to heat the graphite susceptor 21. The amount and placement of the insulation 23 are selected to create a thermal gradient between the powder source 28 and the growing crystal 26 when the susceptor 21 heats the powder 24 to sublimation temperatures, which are typically on the order of about 2300° C. The thermal gradient is established to maintain the temperature of the seed 24 and thereafter the growing crystal 26 near, but below the sublimation temperature of silicon carbide to thereby thermodynamically encourage the vaporized species that are generated when silicon carbide sublimes (Si, Si2C, and SiC2) to condense first upon the seed crystal and thereafter upon the growing crystal. As one example, U.S. Pat. No. 4,866,005 suggests maintaining the seed at about 2300° C.

For purposes of clarity, the singular term, "thermal gradient," will be used herein, but it will be understood by those of skill in this art that several gradients can desirably co-exist in the susceptor 21 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed crystal 24 and then on the growing crystal 26 in the same polytype as the seed crystal 24.

Figure 12:
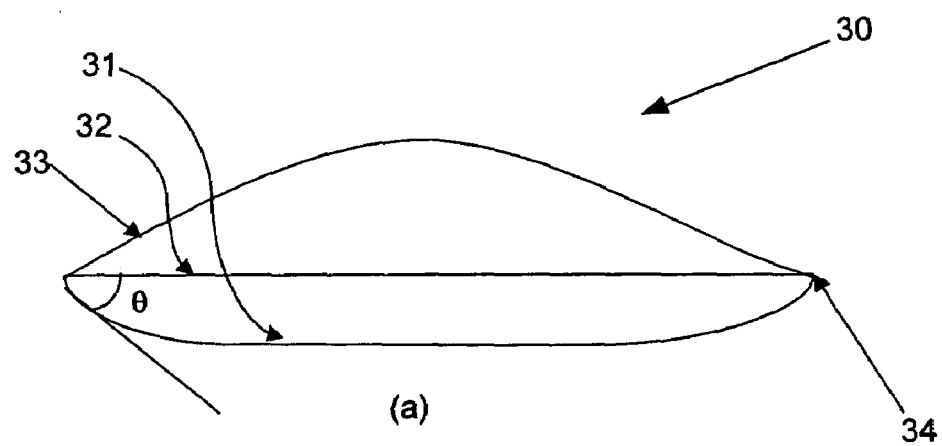
FIG. 12 is a schematic illustration of some of the factors related to the present invention.
Figure 12:
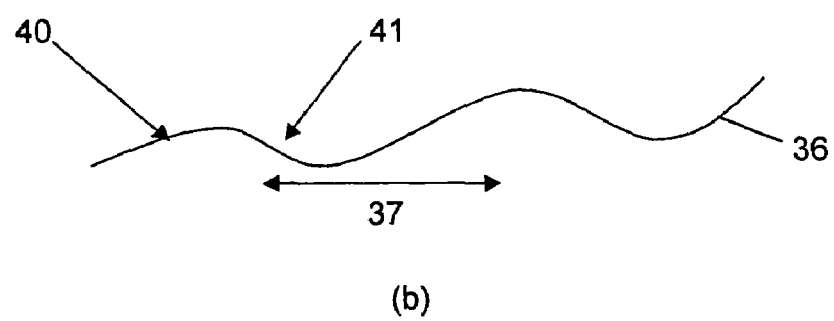

FIG. 12 is an exaggerated schematic illustration of some of the factors related to the present invention. It will be understood that FIG. 7 is entirely schematic and illustrative in nature and is not meant to represent, either in scale or in exact shape, any particular crystal.

FIG. 12a illustrates a crystal seed broadly illustrated at 30 with three different types of growth surfaces being respectively indicated at 31, 32 and 33. The growth surface indicated by the arrow 31 is concave and according to the invention will be considered to be excessively concave if the growth surface deviates from flat by more than 10 μm.

The surface illustrated by the arrow 33 is considered excessively convex, again because the deviation from a flat surface is more than 10 μm.

An appropriate flat surface is indicated by the arrow 32 and extends across the entire usable area of the crystal, the boundary of which is designated by the arrow 34.

The FIG. 12b schematically illustrates problems that can arise in "local" areas of the crystal surface in which the growth surface is indicated at 36 and the dimensions of the local area (as defined herein) are indicated by the horizontal arrow 37. The arrows 40 and 41 indicate respective areas of high local curvature that can affect the growth in a disadvantageous manner in the same way as the overall undesirable growth shapes illustrated in FIG. 12a.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch and 100 mm diameter single crystals are preferred.

The invention provides an improvement in the nature and handling of seed crystals in the growth environment in a manner that enables large crystals of desired diameters to be obtained.

In another sense, the nature of certain power devices is such that even in the semiconductor context, in which devices are typically physically much smaller than are equivalent conventional devices, some devices must still be relatively large and thus require large substrates and large defect-free single crystals. The invention provides its advantages in the context of the larger crystals that are required for such larger devices. Thus, previous single crystals, even those of high quality, that cannot match the absolute dimensions of the crystals described and claimed herein are not relevant to the evaluation of the invention.

Even in situations or devices that do not require larger substrates, the normal and relevant goals of increasing the usable amount of any given bulk single crystal still apply. Thus the invention offers its advantages in terms of such larger bulk crystals rather than in a mere conceptual context in which size has no performance or commercial value.

Although it may initially appear contradictory to refer to seed crystals having otherwise thin profiles as being "thick," it will be understood that the goal of the invention is to provide a seed crystal that is thin for overall efficiency purposes but thick enough for the physical and thermal purposes of the invention. Stated differently, if all other conditions were perfect or ideal, the amount of seed crystal required would be no more than the smallest that could still encourage single polytype growth upon its surface. From the opposite standpoint, if silicon carbide were an easy or inexpensive material to grow or produce, the thickness of the seed crystal would not matter for efficiency purposes. In the present invention, however, the goal is to maximize the use of each seed crystal, which encourages the use of thin seeds. Within the context of efficiently thin seeds, however, the ratios described in claim herein helps solve the described problems.

Figure 9:
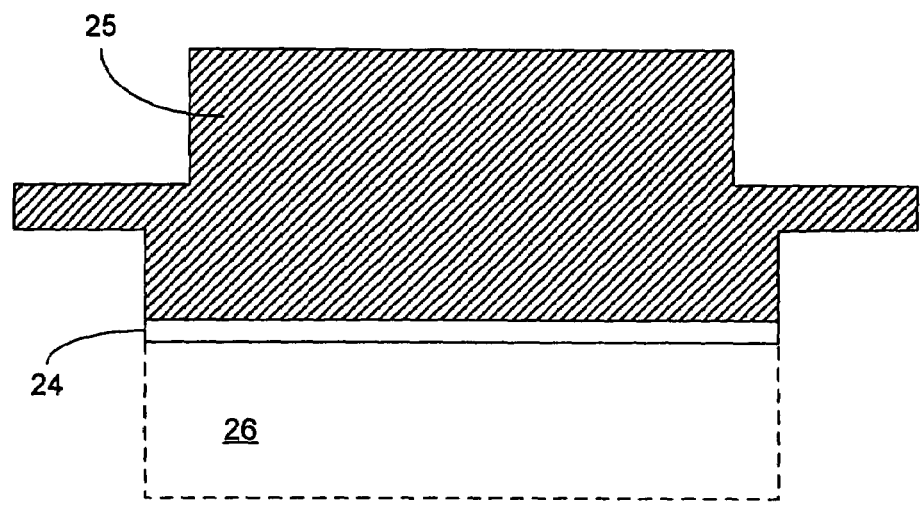
FIGS. 9 and 10 are respective cross-sectional schematic diagrams of seed holders, seed crystals, and growing crystals relating to the present invention.
Figure 10:
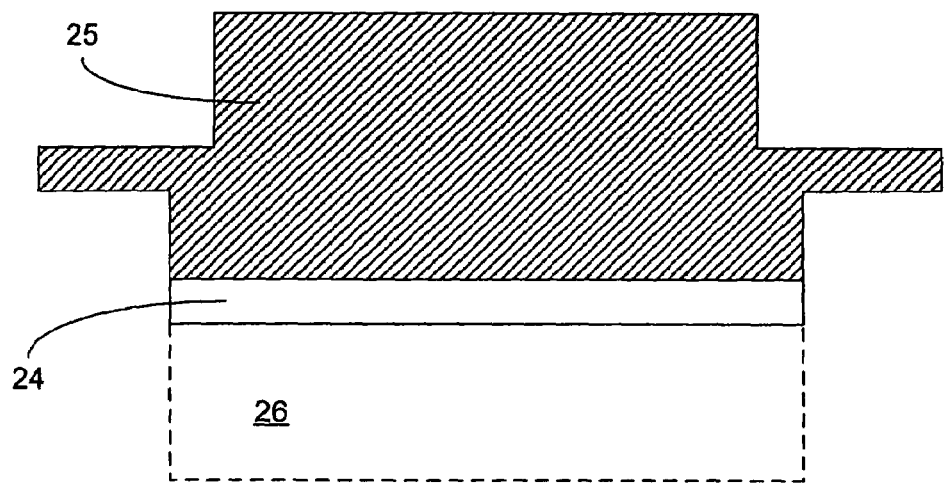

FIGS. 9 and 10 are schematic illustrations of the relative size differential in the seed crystals according to the present invention. In both figures the seed holder is illustrated at 25, the seed crystal at 24 and the growing seed at 26. Thus, FIG. 9 illustrates (in admittedly exaggerated fashion) a more conventional "thin" seed crystal, while FIG. 10 illustrates a proportionally thicker crystal according to the invention.

In another embodiment, the invention is the improvement in seeded sublimation growth of silicon carbide that comprises lapping both sides of a silicon carbide seed crystal, to minimize or eliminate any warp or bow in the crystal that would otherwise encourage sublimation from the rear of the seed crystal or undesired thermal differences across the seed, thereafter initiating seeded sublimation growth using the lapped crystal, and thereafter growing the bulk single crystal at substantially the same diameter as the seed. In preferred embodiments, the seed is at least 2 inches in diameter and most preferably larger, including diameters of 3 and 100 mm.

In the first embodiment, the purpose of obtaining the proportionally thicker crystal is to prevent the high temperatures to which the crystal is typically exposed from causing the crystal to warp or bow under the thermal stresses generated by those high temperatures. In the next embodiment, the goal is similar; i.e., to prevent undesired crystal growth effects from taking place at the seed crystal, particularly at or from the rear of the seed crystal. In this embodiment, however, lapping and polishing the seed crystal provides an extremely smooth and level surface that helps discourage localized temperature or physical differences across the seed during growth and that also helps to minimize or eliminate the space or spaces that have been identified as being present between the seed crystal and the seed holder in some embodiments.

In a typical technique the crystal is lapped by using an abrasive slurry in conjunction with a hard surface to quickly remove a fairly large amount of material, and thereafter polished by using a similar slurry, but in a milder fashion and with a softer surface to produce a finished surface of semiconductor material. Such techniques are well known in the art and can be selected and used by those of ordinary skill without undue experimentation and thus will not be described in further detail herein.

In another embodiment, the invention is the improvement in seeded sublimation growth that comprises positioning the seed crystal in a crucible while minimizing or eliminating torsional forces on the seed crystal to thereby prevent the torsional forces from warping or bowing the crystal in a manner that would otherwise encourage sublimation from the rear of the seed crystal or undesired thermal differences across the seed.

Once again, the goal is to use the nature and positioning of the seed crystal in a manner that prevents undesired defect generation in the seed during sublimation growth to thereby prevent those defects from being propagated into the growing bulk crystal.

In this embodiment, the method preferably comprises positioning the seed crystal on a seed holder and placing the seed holder and the seed crystal in the crucible portion of the seeded sublimation system. Most preferably, this comprises mounting the seed crystal in an edge ring seed cap and positioning the edge ring seed cap in the seed holder to thereby minimize the mechanical forces applied to the seed crystal to in turn minimize or eliminate any distortion in the seed crystal resulting from its mounting on the seed holder.

Although the down-force applied to the ring has not been directly measured, by inference from other measurements and techniques, the force is estimated to be about one Newton and the dimensions of the ring are such as to apply this amount of force to the outer 1 mm of the seed wafer.

Figure 11:
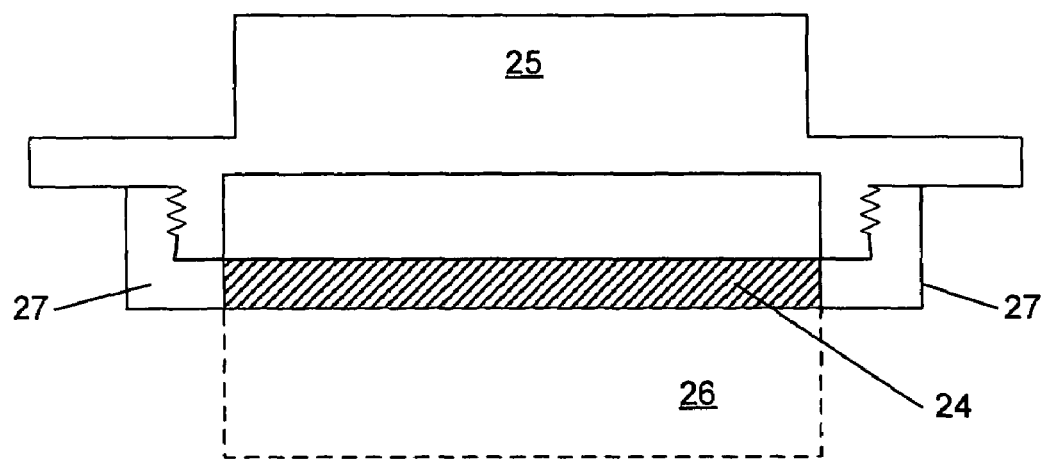
FIG. 11 is a cross-sectional schematic diagram of a seed holder and silicon carbide seed crystal according to the present invention.

FIG. 11 illustrates an edge ring seed cap of this type designated at 27, with the other common elements carrying the same reference numerals as in FIGS. 9 and 10. Thus, the edge ring seed cap 27 carries the seed crystal 24 and thereafter the growing crystal 26. In turn, the edge ring seed cap 27 is threaded to the seed holder 25, which is incorporated in the overall system as schematically illustrated in FIG. 8.

As noted above, this embodiment can also include the advantages of the previous to embodiments; i.e., the crystal can be "thick" enough for thermal purposes and can be double lapped to provide the desirably smooth surfaces.

In yet another embodiment, the improvement according to the invention comprises annealing the seed holder prior to sublimation growth to prevent the seed holder from significant distortion during crystal growth at silicon carbide sublimation temperatures to thereby minimize or eliminate temperature differences across the seed that would otherwise tend to initiate and propagate defects into the growing bulk crystal. Thereafter, the method comprises initiating seeded sublimation growth with the seed crystal, and then growing the bulk single crystal at substantially the same diameter as the seed crystal.

The time and temperature profile for annealing the seed holder can be selected by those of ordinary skill in this art without undue experimentation based upon the relatively well understood characteristics and properties of materials such as graphite which are typically used in most suitable susceptors and seed holders. In a particular embodiment using a graphite seed holder, however, the method comprises annealing the seed holder at a temperature of at least about 2500° C. for a period of at least about 30 minutes.

The relevant terms will be understood by those of ordinary skill in this art, but for purposes of confirmation, the term "uniform" refers to a consistent surface as observed by the eye or with a microscope. "Uniform" also refers to consistency for areas ranging in lateral dimensions from the wafer diameter down to areas as small as 10 µm. The term "flat" means that the crystal forms a basal facet in such a region. Flat also refers to a slope of less than one degree and the term "slightly convex" refers to a radius of curvature of less than 40 cm. Thus, the surface is "too convex" if its overall convexity exceeds the stated levels and the surface is "too concave" if the growth surface deviates from flat by more then the stated angle (i.e., preferably one degree).

Those familiar with the growth of silicon carbide crystals will also understand that this undesired curvature can occur in localized areas rather than over the entire seed, but with the same effects that should be avoided. Such localized regions are best understood as being areas that are small as 10 µm in diameter (or across their largest dimension if irregular) up to the full wafer diameter which is typically on the order of 2 in., 3 in., or 100 mm.

In this aspect, the method preferably comprises maintaining the flat to slightly convex growth surface during the first 500 µm to 10 mm of the crystal growth over the usable diameter of the crystal. As part of this aspect, it has been discovered that the shape of the growing crystal at the early stages of growth is more important than has been generally recognized to date. Conventionally, the growth is considered satisfactory if the overall resulting bulk crystal has a convex surface when growth is complete or otherwise large enough to observe. In contrast, the present invention includes the recognition that concave growth at early stages tends to generate micropipes that propagate throughout the crystal even if the end result is an appropriately convex-surface bulk crystal. As noted elsewhere herein, conventional thought believes that micropipes initiate at the rear (non-growth) surface of the seed crystal. In contrast, the invention recognizes that micropipes initiate at the front surface (the seed-growth interface) and their avoidance must be addressed at that location as well as elsewhere.

The term "usable area" is likewise understood by those of ordinary skill in this art and represents the area of the crystal that will be selected and used to fabricate substrates. As an example, the crystal could be grown with a diameter of 150 mm for the purpose of cutting a 75 mm diameter portion and making wafers from this smaller portion. In such a case, the usable area would be represented by the selected 75 mm portion. As another example, a 150 mm crystal could be directly cut into 150 mm wafers of which only the center 75 mm diameter portion is high quality material with the outer portion being lower-quality material. In this case, the usable area would refer to the high quality (low defect level) region.

The preferred control over the early growth thicknesses of between 500 µm and 10 mm defines the invention in contrast to previous work in which boules of silicon carbide have been produced and then either polished, cut, or sometimes grown, with a resulting flat top surface. In contrast, the invention represents the step of starting growth with a flat seed.

Without being held to any particular representations or admissions, the inventors believe that crystals as small as 10 mm in thickness have never been demonstrated with the shape (flat) characteristics disclosed and claimed herein. With respect to the 500 µm lower limit, this represents a reasonable general border that distinguishes the invention from growth processes in which the growth is carried out in concave fashion for 500 µm and thereafter flattened.

The method can further comprise using the temperature distribution in the sublimation crucible to produce the uniform flat to uniform slightly convex growth face. As is generally well understood in this art, the temperature profile in a crucible can be controlled using several different techniques to obtain desired gradients, isotherms, or other temperature effects. To some extent, these profiles can also be affected by the position in which the source materials, including silicon and carbon gas species, are introduced into the crucible.

In certain embodiments, the seed holder is made of graphite and the graphite is densified by applying organic materials to improve the thermal uniformity of the material under growth conditions. Although the exact density measurements (and their changes) have not been determined, the organic materials that have been found to provide satisfactory results include mixtures of alcohols and resins, such as a mixture of furfuryl alcohol and phenolic ("Novalac") resin in a ratio of 2.5:1. To date, growth improvements based on densifying the seed holder represent empirical observations. Although the inventors do not wish to be bound by any particular theory, possible explanations include the consideration that porous graphite more readily permits undesired sublimation from the rear of the seed, or the consideration that porous graphite exhibits uneven thermal properties.

Phenolic resins are generally well understood in the chemical arts and an appropriate composition can be selected by those of ordinary skill in this art without undue experimentation. As a brief summary, phenolic resins are the condensation products of phenol or substituted phenols with aldehydes. Phenolic resins are thermosetting and do not include elements such as sulphur or nitrogen that tend to generate casting or molding defects in a finished seed holder and that would generally be disadvantageous in the sublimation techniques described herein.

In another aspect, the seed holder is graphite that is selectively matched in terms of its coefficient of thermal expansion to the silicon carbide seed material to help ensure that the gap between the seed in the seed holder does not exceed 10 m. A number of grades of graphite are commercially available and an appropriate graphite for this purpose can be selected by those of ordinary skill in this art without undue experimentation.

In another aspect of the invention, the thermal consistency between the seed crystal and the seed holder is accomplished by separating the seed and the seed holder in an arrangement that encourages radiative heat transfer to dominate over conductive heat transfer over substantially the entire usable area of the crystal. This embodiment has the same theme, goal, and function as the earlier embodiments—avoiding thermal inconsistencies (typically conductive ones) between the seed and the seed holder.

In this aspect, however, the thermal consistency is achieved by designing and keeping a sufficient gap between the seed and the seed crystal so that conductive heat transfer is avoided, thus avoiding the potential for inconsistent conductive heat transfers to encourage defects in the seed or in the growing crystal. As used herein, the term "gap" refers to the distance between the seed and the seed holder, but is not necessarily limited to describing empty space.

Thus, the gap can be filled with any desired material—solid, liquid, or gas—or it can even be a vacuum, provided it serves the required purpose and does not otherwise interfere with the sublimation growth.

As noted in the Background, sublimation from the rear of a seed crystal ("thermal etching") has been observed and can initiate defects. Accordingly, in another aspect, a thin film can be applied to the back surface of the seed to prevent thermal etching of that surface, or to prevent sublimation growth on the rear surface of the seed that would create an undesired conductive heat transfer between the seed and the seed holder. The thin film creates a diffusion barrier that prevents the silicon carbide from subliming through the barrier. The thin film is selected from materials that will remain stable without subliming, melting, or evaporating at the growth temperatures, and that will not otherwise interfere with the sublimation growth techniques. Appropriate materials include but are not necessarily limited to, graphite, certain refractory metals, and metal carbides such as titanium carbide.

As in the other embodiments, the silicon carbide seed crystal is preferably selected to have a polytype selected from the group consisting of the 3C, 4H, 6H, and 15R polytypes of silicon carbide.

Additionally, it will be understood that the methods described herein are complementary rather than exclusive of one another, and thus several of the steps can be used concurrently or sequentially to achieve the desired result. Furthermore, the method has similar advantages for other semiconductor materials such as gallium nitride, aluminum gallium nitride, and aluminum nitride.

In yet another embodiment, the invention comprises the improvement in seeded silicon carbide growth of positioning a seed crystal on a seed holder using a low porosity backing material that provides a vapor barrier to silicon carbide sublimation from the seed and that minimizes the difference in thermal conductivity between the seed and the backing material to minimize or eliminate temperature differences across the seed and likewise minimize or eliminate vapor transport from the rear of the seed that would otherwise initiate and propagate defects from the rear of the seed towards the growth surface. In particular, the backing material should be selected so that its coefficient of thermal expansion at sublimation growth temperatures is as close as possible to that of the SiC seed crystal.

As used herein, the "back" or "rear" of the seed crystal refers to the surface that faces the seed holder. Thus, the "front" of the seed crystal represents the surface upon which bulk growth takes place.

Again, the technique of the embodiment is consistent with the goal of preventing sublimation from the rear of the seed crystal during growth because such sublimation tends to generate defects into and through the seed crystal and thereafter into and through the growing bulk single crystal.

In another aspect of this embodiment, the seed can be positioned on the seed holder with a high temperature adhesive, one examples of which includes graphite glue.

In yet another aspect of this embodiment, the method can comprise bonding the seed crystal to the seed holder with an appropriate material.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A silicon carbide wafer comprising:
   a single polytype single crystal;
   a diameter greater than three inches and less than five inches;
   a resistivity greater than 10,000 ohm-cm;
   a micropipe density less than 200 cm$^{-2}$; and
   a combined concentration of shallow level dopants less than 5E16 cm$^{-3}$.

2. A wafer according to claim 1 having a diameter of about 100 mm.

3. A wafer according to claim 1 having less than 100 micropipes per square centimeter.

4. A wafer according to claim 1 having less than 30 micropipes per square centimeter.

5. A wafer according to claim 1 having less than 15 micropipes per square centimeter.

6. A wafer according to claim 1 having less than five micropipes per square centimeter.

7. An on-axis silicon carbide wafer according to claim 1.

8. An off-axis silicon carbide wafer according to claim 1.

9. A silicon carbide wafer according to claim 8 wherein the amount of off-axis orientation is selected from the group consisting of 8°, 4° degrees, and 3.5°.

10. A wafer according to claim 1 wherein said polytype is selected from the group consisting of the 3C, 4H, 6H and 15R polytypes of silicon carbide.

11. A wafer according to claim 1 further comprising an epitaxial layer.

12. A wafer and epitaxial layer according to claim 11 wherein the epitaxial layer is selected from the group consisting of silicon carbide and Group III nitrides.

13. A device that incorporates the wafer and epitaxial layer according to claim 12.

14. A device according to claim 13 selected from the group consisting of FET's, MOSFET's, JFET's, MESFET's, HFET's, HEMT's, extended drain MOSFET's, and lateral DMOS transistors.

15. A wafer according to claim 1 having a concentration of nitrogen atoms less than about $2 \times 10^{15}$ cm$^{-3}$.

16. A wafer according to claim 1 wherein the concentration of vanadium is less than $1 \times 10^{14}$ cm$^{-3}$.

17. A wafer according to claim 1 having a resistivity of at least 50,000 Ω-cm at room temperature.

18. A wafer according to claim 1 having a concentration of point defects that does not exceed $5 \times 10^{17}$ cm$^{-3}$.

19. A wafer according to claim 1 comprising:
   donor dopants, acceptor dopants, and intrinsic point defects in said silicon carbide single crystal;
   wherein the number of dopants of a first conductivity type is greater than the number of dopants of a second conductivity type; and
   the number of intrinsic point defects in said silicon carbide crystal that act to compensate the predominating first type dopant is greater than the numerical difference by which said first type of dopant predominates over said second type of dopant; and
   the concentration of transition elements is less than $1 \times 10^{16}$ cm$^{-3}$.

20. A wafer according to claim 19 wherein said first type dopants are donors, said second type dopants are acceptors and said intrinsic point defects act as acceptors.

21. A wafer according to claim 20 wherein said acceptors include boron.

22. A wafer according to claim 19 wherein the concentration of vanadium is less than $1\times10^{14}$ cm$^{-3}$.

23. A wafer according to claim 1 comprising:
nitrogen; and
at least one acceptor element having an electronic energy level of between 0.3 and 1.4 eV relative to the valence band of mono-crystalline silicon carbide;
said at least one acceptor element being present in an amount that over compensates the nitrogen and pins the Fermi level of said silicon carbide substrate to the electronic energy level of said at least one acceptor element.

24. A wafer according to claim 1 comprising;
an amount of electrically active nitrogen;
an amount of electrically active point defects that act as acceptors; and
an amount at least one acceptor element having an electronic energy level of between 0.3 and 1.4 eV relative to the valence band of mono-crystalline silicon carbide;
wherein the combined amount of said acceptor element and said point defects is greater than said amount of electrically active nitrogen and pins the Fermi level of said silicon carbide single crystal to the electronic energy level of said at least one acceptor element.

25. A wafer according to claim 1 comprising:
non-intentionally introduced nitrogen;
scandium; and
boron; and wherein
the concentration of nitrogen is greater than the concentration of scandium; and
the concentration of boron is sufficient for the sum concentration of boron and scandium to overcompensate the nitrogen, and pin the Fermi level of said silicon carbide to the level of said scandium.

26. A single crystal silicon carbide wafer having a diameter greater than three inches, a resistivity greater than 10,000 ohm-cm and a micropipe density less than 200 cm$^{-2}$.

27. A wafer according to claim 26 comprising a combined concentration of shallow level dopants less than 5E16 cm$^{-3}$.

28. A single crystal of silicon carbide grown by deposition of vapor species containing Si and C on a seed crystal growth surface, said crystal having a diameter greater than three inches and a resistivity greater than 10,000 ohm-cm.

29. A wafer according to claim 28 comprising a micropipe density less than 200 cm$^{-2}$; and a combined concentration of unintentionally introduced shallow level dopants less than 5E16 cm$^{-3}$.

30. A single crystal of unintentionally doped silicon carbide grown by sublimation of SiC source powder to generate vapor species containing Si and C without intentional introduction of P or N-type dopant atoms, said crystal having a diameter greater than three inches, a resistivity greater than 10,000 ohm-cm, a micropipe density less than 200 cm$^{-2}$; and a combined concentration of unintentionally introduced shallow level dopants less than 5E16 cm$^{-3}$.

\* \* \* \* \*

UNITED STATES PATENT AND TRADEMARK OFFICE
CERTIFICATE OF CORRECTION

PATENT NO. : 7,601,441 B2
APPLICATION NO. : 10/876963
DATED : October 13, 2009
INVENTOR(S) : Jason Ronald Jenny et al.

It is certified that error appears in the above-identified patent and that said Letters Patent is hereby corrected as shown below:

Title Page; item (75);
On the cover page under INVENTORS delete: "Valerl F. Tsvetkov"
and insert -- Valeri F. Tsvetkov --

In the Detailed Description:
COLUMN 9, LINE 46 delete: "tronic energy level of between 0.3 and 1.4 volts relative to the"
and insert -- tronic energy level of between 0.3 and 1.4 electron volts relative to the --

In the Detailed Description:
COLUMN 27, LINE 67 delete: "most perferably larger, including diameters of 3 and 10 mm.
and insert -- most perferably larger, including diameters of 3 inches and 10 mm. --

Signed and Sealed this

Eighth Day of December, 2009

David J. Kappos
*Director of the United States Patent and Trademark Office*